(12) United States Patent
Li et al.

(10) Patent No.: US 11,775,374 B2
(45) Date of Patent: Oct. 3, 2023

(54) STATE-BY-STATE PROGRAM LOOP DELTA DETECTION MODE FOR DETECTING A DEFECTIVE MEMORY ARRAY

(71) Applicant: Western Digital Technologies, Inc., San Jose, CA (US)

(72) Inventors: Liang Li, Shanghai (CN); Chenxiao Xu, Shanghai (CN); Qin Zhen, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 189 days.

(21) Appl. No.: 17/231,344

(22) Filed: Apr. 15, 2021

(65) Prior Publication Data

US 2022/0334902 A1  Oct. 20, 2022

(51) Int. Cl.
| | |
|---|---|
| *G06F 11/07* | (2006.01) |
| *G11C 11/56* | (2006.01) |
| *G11C 16/04* | (2006.01) |
| *G11C 16/34* | (2006.01) |
| *G11C 16/10* | (2006.01) |
| *H10B 41/27* | (2023.01) |
| *H10B 43/27* | (2023.01) |

(52) U.S. Cl.
CPC ........ *G06F 11/079* (2013.01); *G06F 11/0727* (2013.01); *G06F 11/0754* (2013.01); *G11C 11/5628* (2013.01); *G11C 11/5671* (2013.01); *G11C 16/0483* (2013.01); *G11C 16/10* (2013.01); *G11C 16/3459* (2013.01); *H10B 41/27* (2023.02); *H10B 43/27* (2023.02)

(58) Field of Classification Search
CPC . G06F 11/079; G06F 11/0727; G06F 11/0754
See application file for complete search history.

(56) References Cited

U.S. PATENT DOCUMENTS

| | | | |
|---|---|---|---|
| 8,379,454 B2 | 2/2013 | Kochar et al. | |
| 9,165,683 B2 | 10/2015 | Tam | |
| 9,224,495 B2 | 12/2015 | Jung et al. | |
| 9,269,446 B1 | 2/2016 | Magia et al. | |
| 10,210,921 B1* | 2/2019 | Hwang | G11C 11/2255 |
| 10,529,435 B2 | 1/2020 | Puthenthermadam et al. | |
| 11,361,835 B1* | 6/2022 | Lien | G11C 16/32 |
| 2012/0163083 A1* | 6/2012 | Dutta | G11C 16/3436 |
| | | | 365/185.17 |
| 2019/0392909 A1* | 12/2019 | Yang | G11C 16/10 |

(Continued)

*Primary Examiner* — Jigar P Patel
(74) *Attorney, Agent, or Firm* — Vierra Magen Marcus LLP

(57) ABSTRACT

Apparatuses and techniques are described for detecting a defect in a memory cell array during program operations. A defect can be detected by comparing the programming speed of memory cells connected to different word lines, for one or more programmed data states. The comparison can involve adjacent word lines in a block, or word lines in different blocks and planes. The comparison involves comparing two word lines in terms of a number of program-verify loops used to reach the programmed data states or to transition between programmed data states. If a program loop delta is not within an allowable range for one or more of the programmed data states, it can be concluded that a defect is present. The block which has the slower programming word line can be identified as a bad block.

20 Claims, 23 Drawing Sheets

(56) References Cited

U.S. PATENT DOCUMENTS

| | | | |
|---|---|---|---|
| 2021/0343351 A1* | 11/2021 | Chiang | G11C 16/3459 |
| 2022/0223209 A1* | 7/2022 | Zainuddin | G11C 16/0483 |
| 2022/0230692 A1* | 7/2022 | Jiang | G11C 16/10 |

* cited by examiner

Fig. 1A
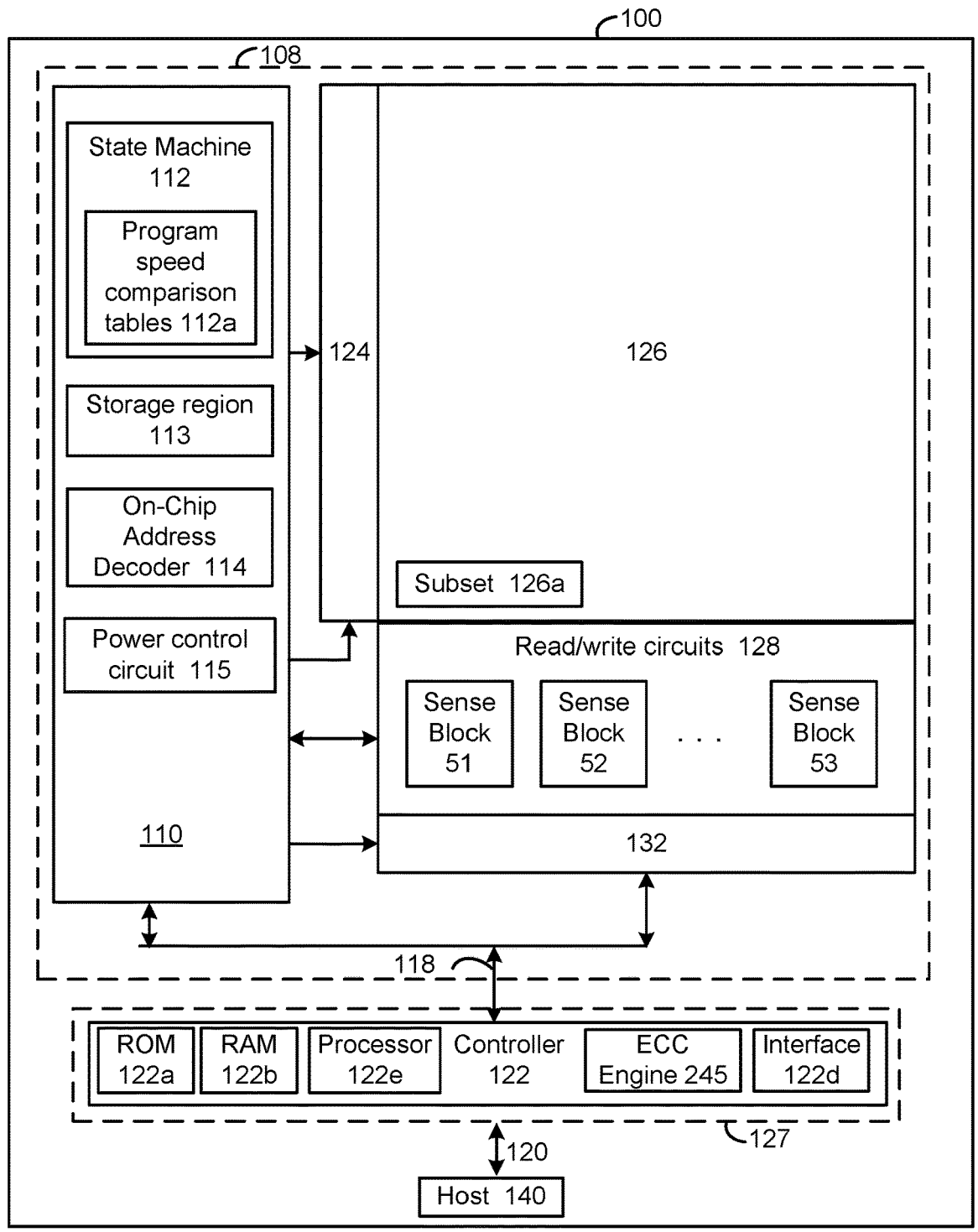
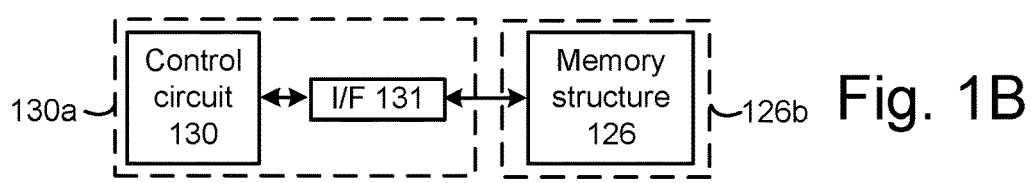
Fig. 1B

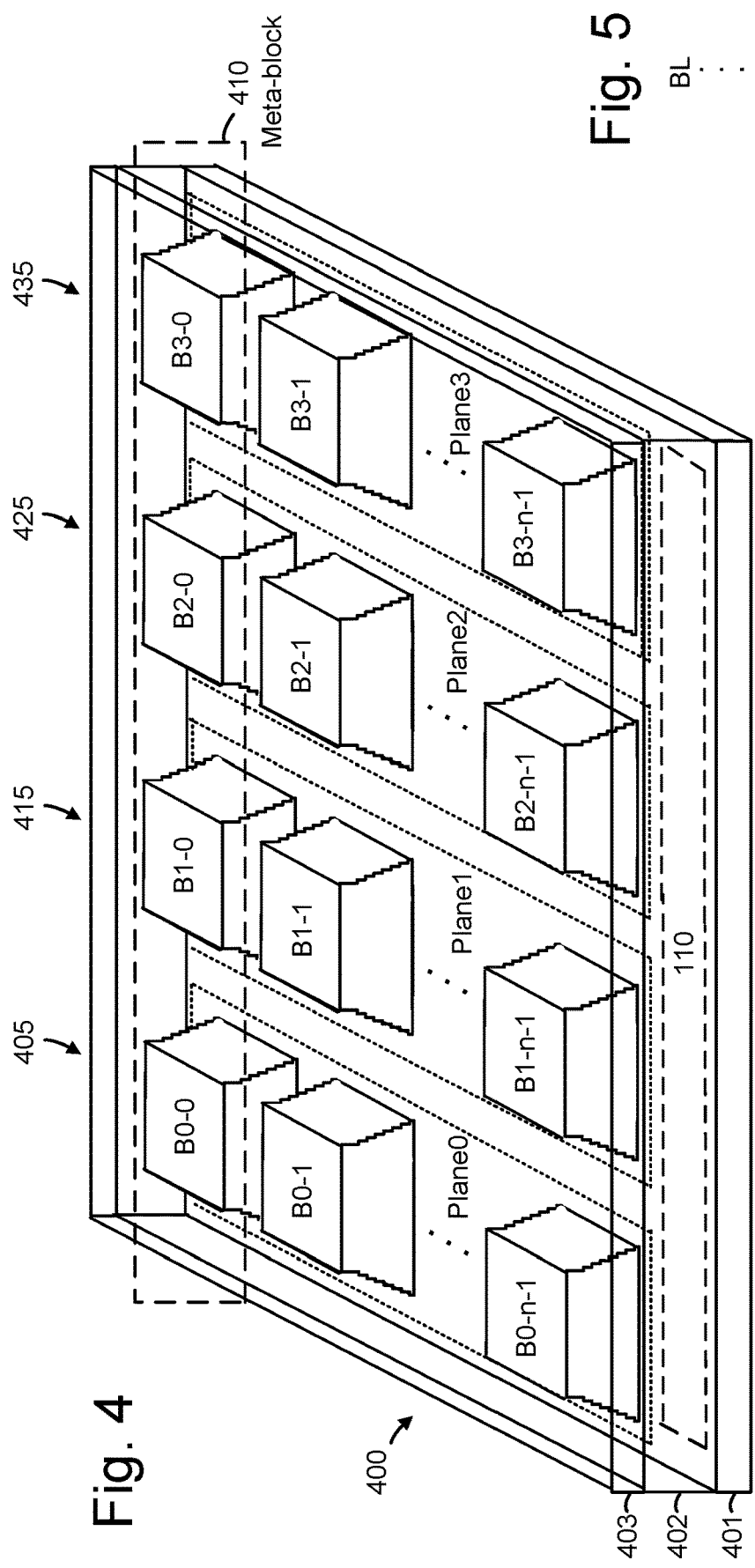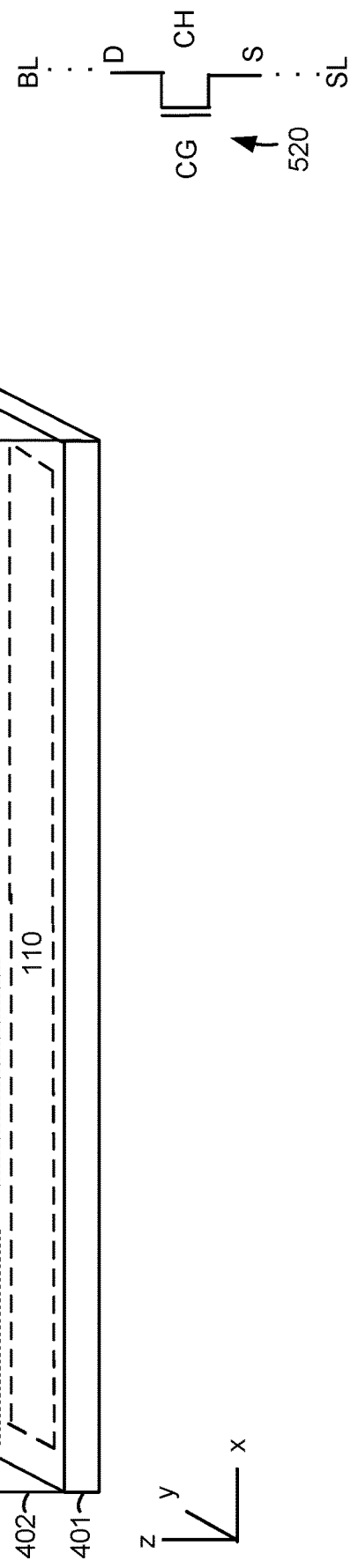

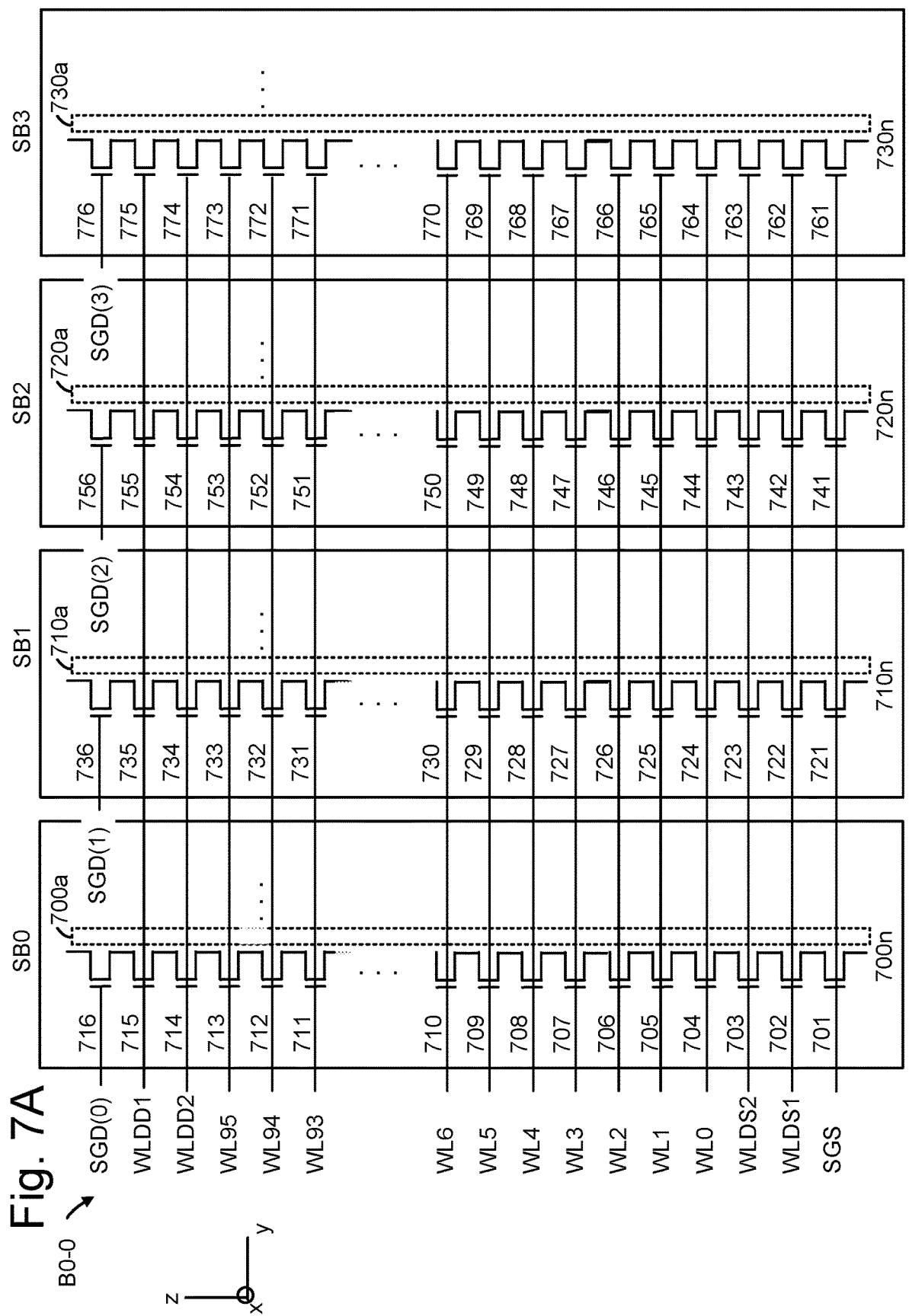

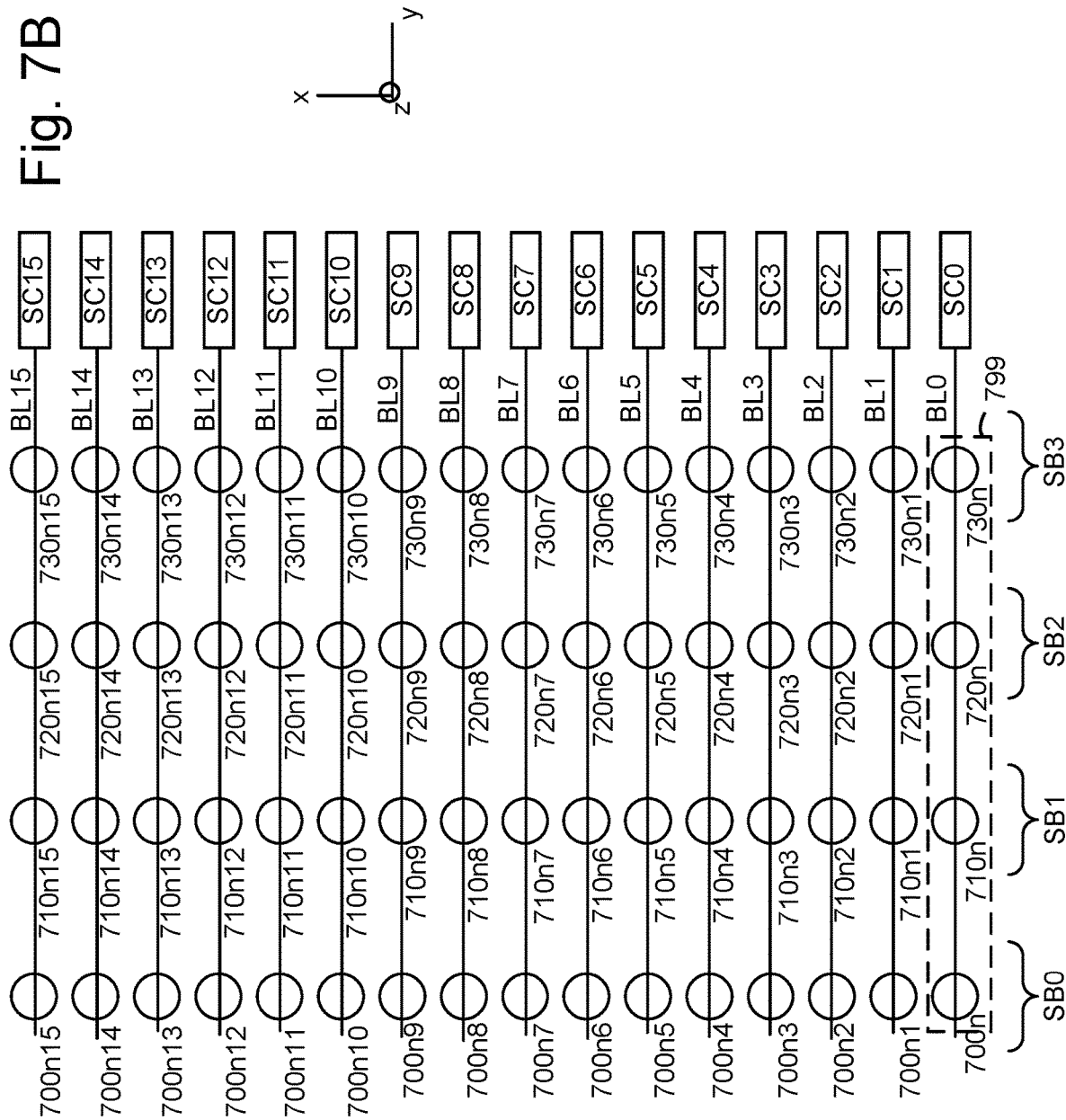

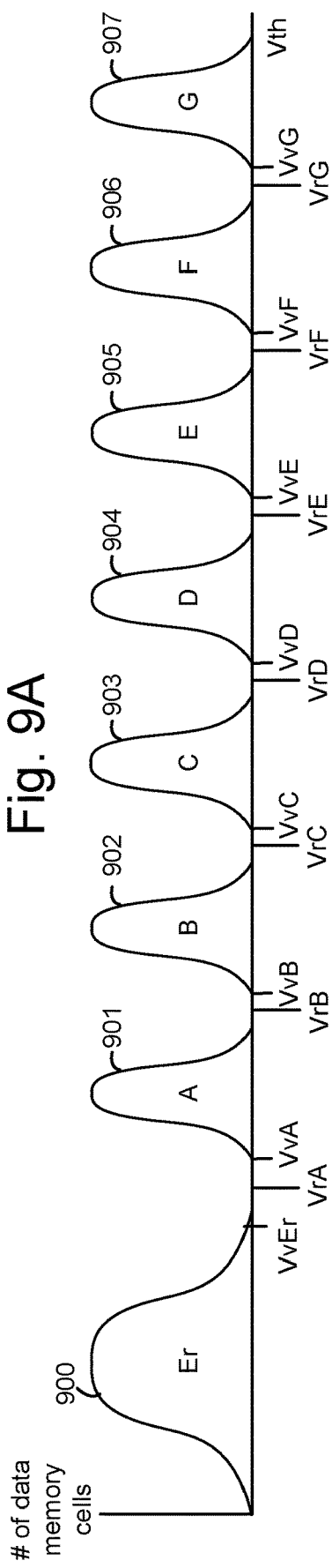
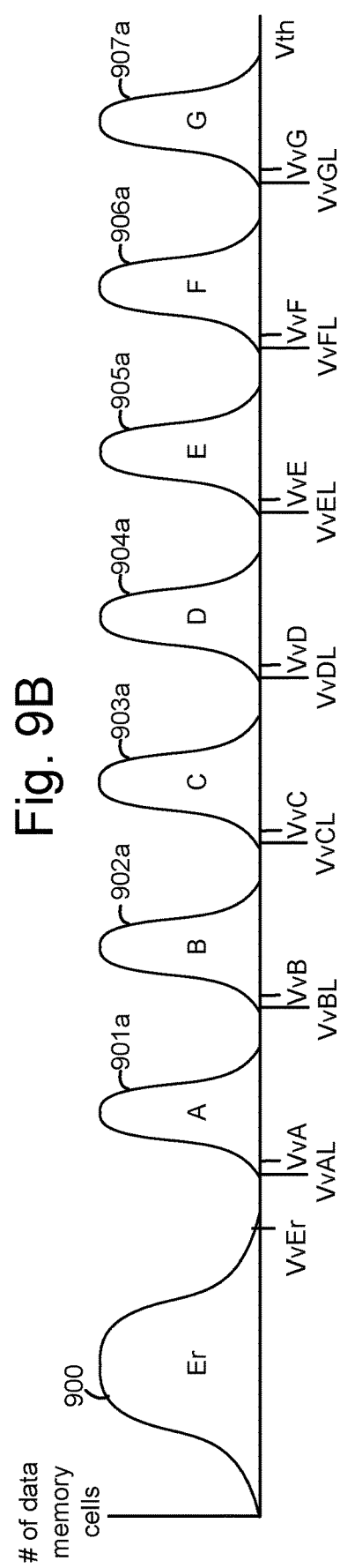

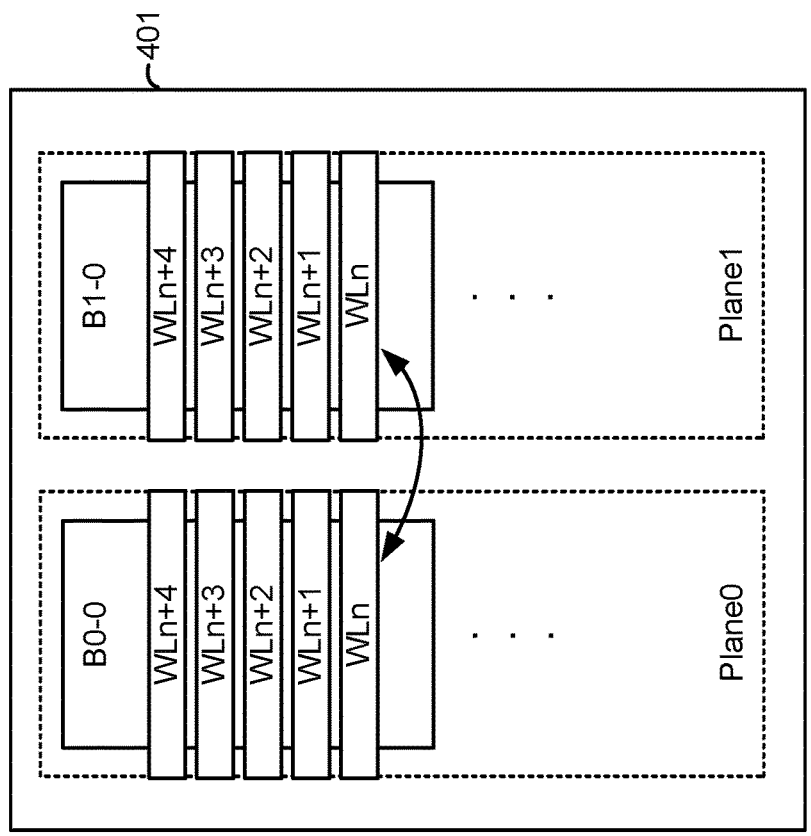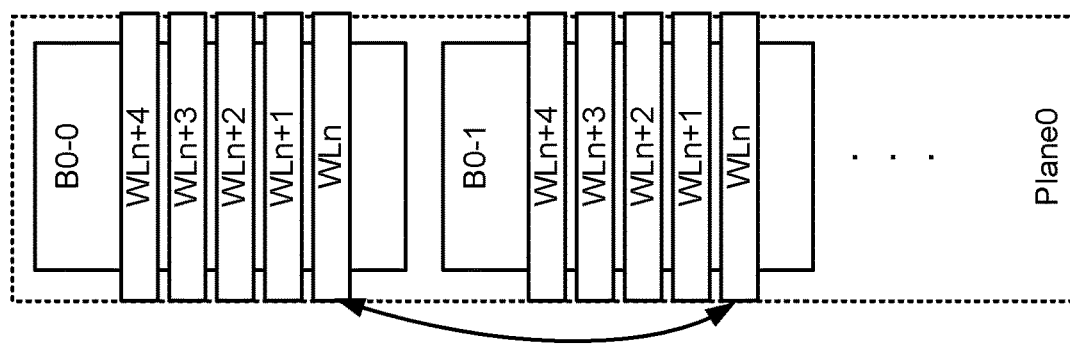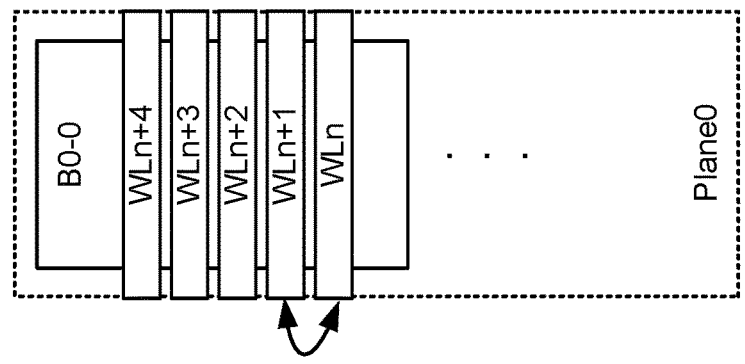

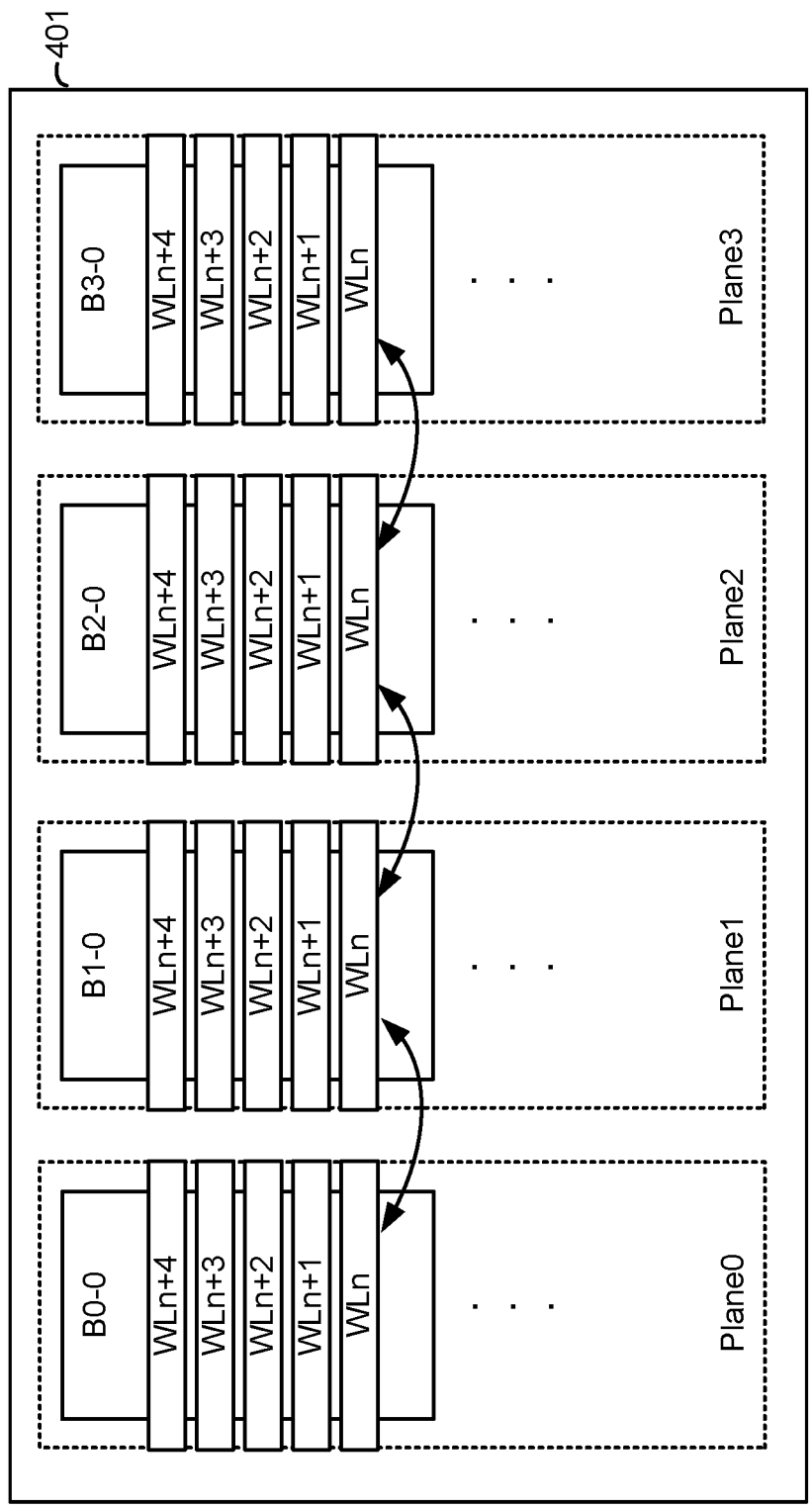

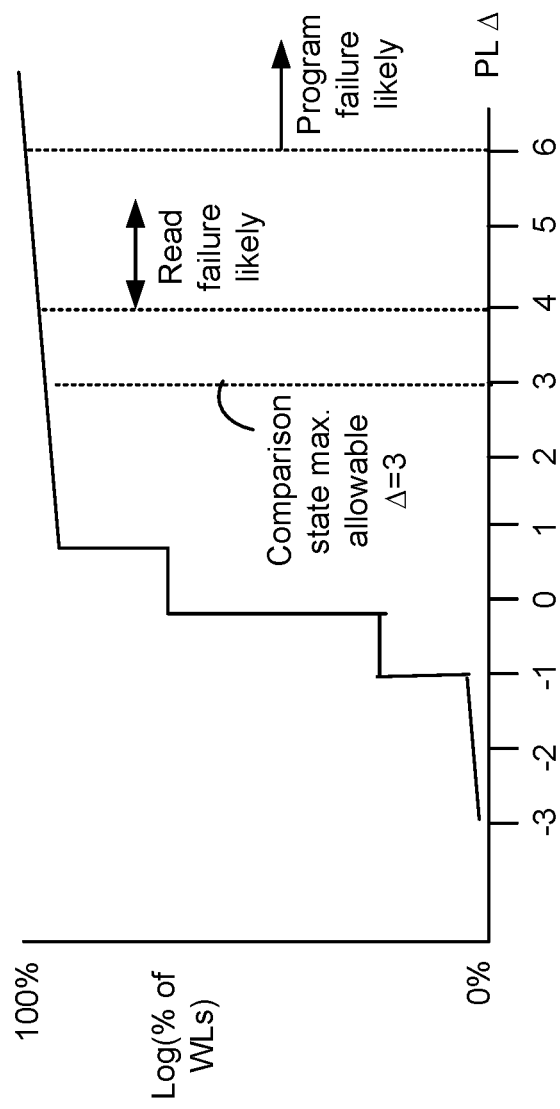

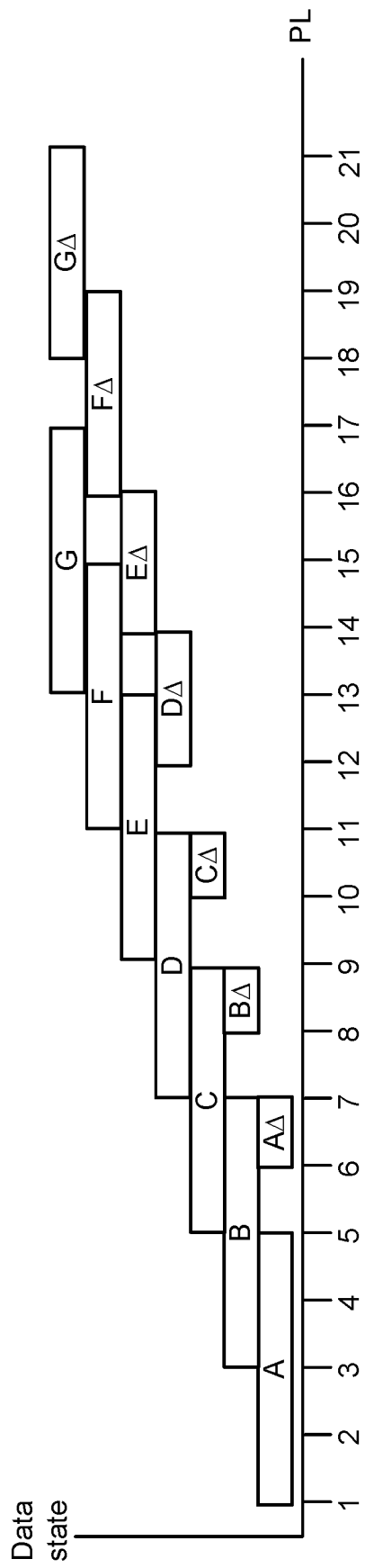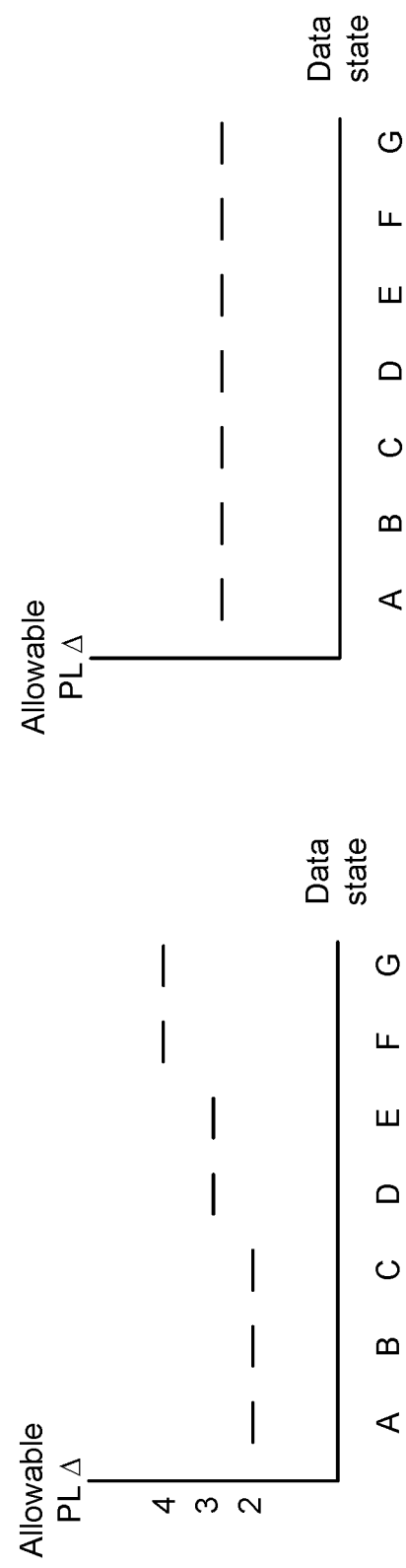

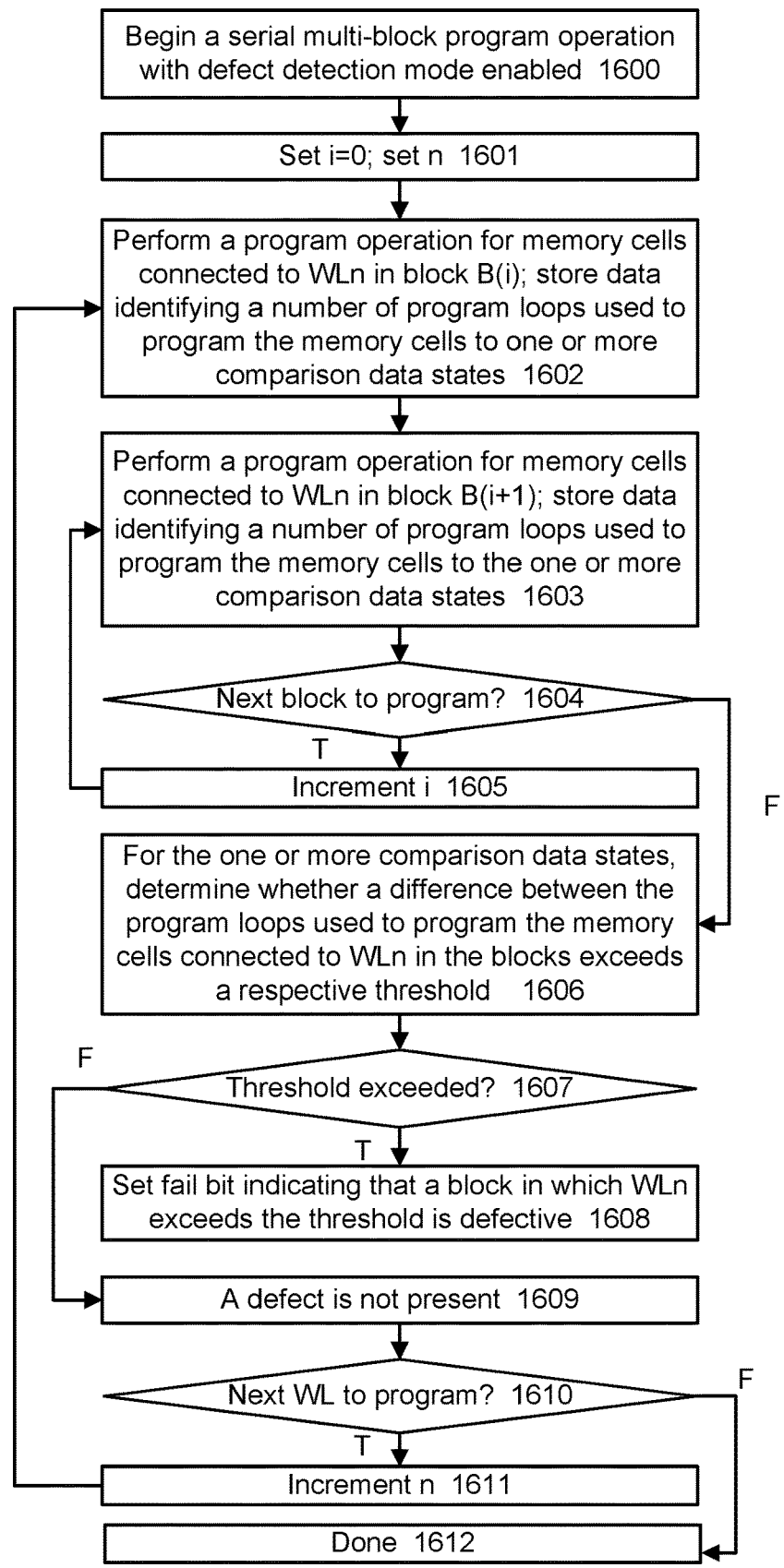

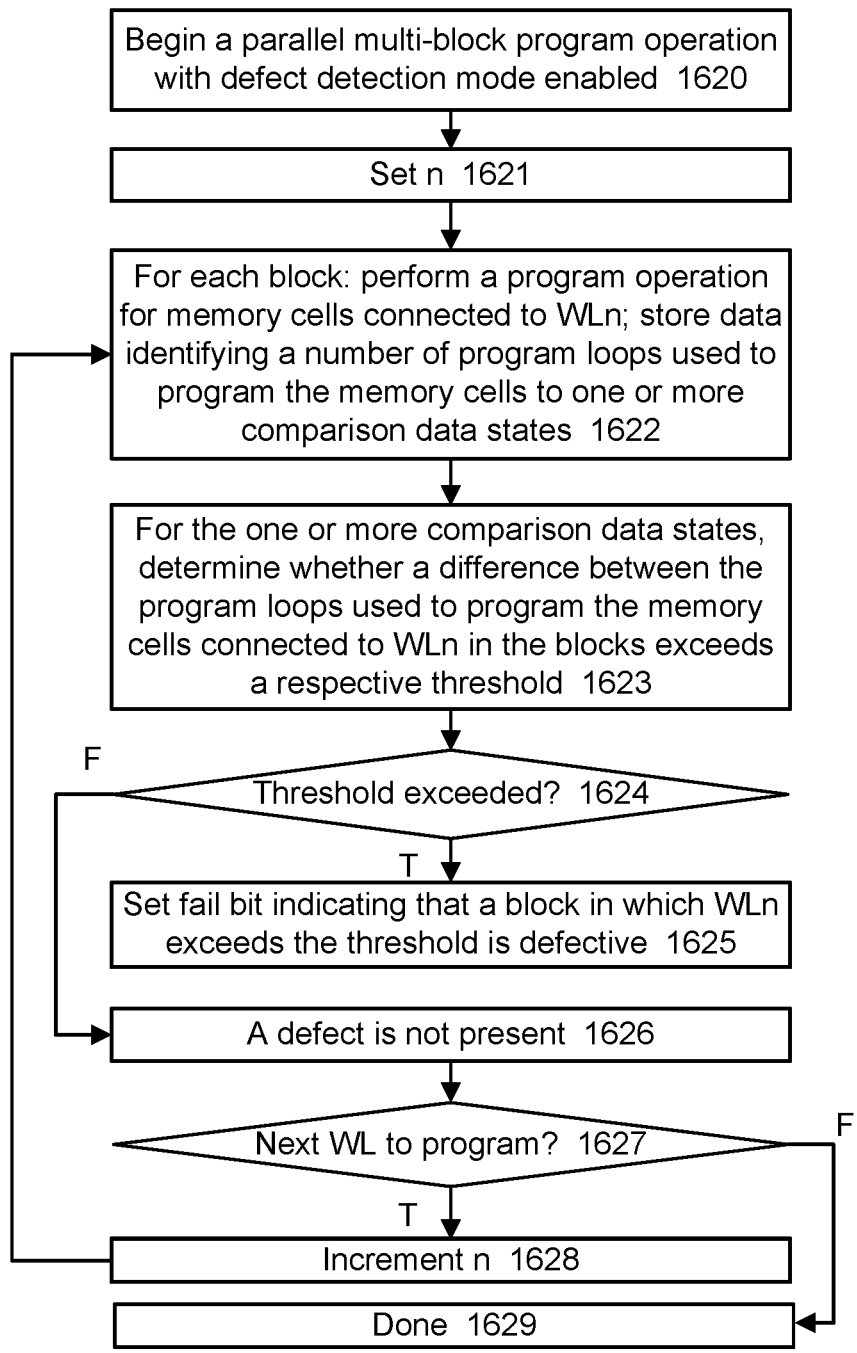

| Data state | PL WLn | PL WLn+1 | \|PL(WLn+1)-PL(WLn)\| | Allowable Δ | Out of range? |
|---|---|---|---|---|---|
| A | 6 | 8 | 2 | 2 | No |
| B | 8 | 10 | 2 | 2 | No |
| C | 10 | 12 | 2 | 3 | No |
| D | 12 | 15 | 3 | 3 | No |
| E | 14 | 18 | 4 | 3 | Yes |
| F | 16 | 21 | 5 | 4 | Yes |
| G | 18 | 23 | 5 | 4 | Yes |

| Data state | PL WLn(B0-0) | Δ0 | PL WLn(B1-0) | Δ1 | Allowable Δ | Out of range: |
|---|---|---|---|---|---|---|
| A | 6 | 1 | 5 | 0 | 2 | none |
| B | 8 | 1 | 7 | 0 | 2 | none |
| C | 10 | 1 | 9 | 0 | 2 | none |
| D | 12 | 1 | 11 | 0 | 3 | none |
| E | 13 | 1 | 13 | 0 | 3 | none |
| F | 15 | 1 | 15 | 0 | 4 | none |
| G | 17 | 0 | 18 | 1 | 4 | none |

Fig. 18C

| Data state | PL WLn(B0-0) | Δ0 | PL WLn(B1-0) | Δ1 | PL WLn(B2-0) | Δ2 | PL WLn(B3-0) | Δ3 | Allowable Δ | Out of range? |
|---|---|---|---|---|---|---|---|---|---|---|
| A | 6 | 1 | 5 | 0 | 7 | 2 | 7 | 2 | 2 | none |
| B | 8 | 1 | 7 | 0 | 9 | 2 | 9 | 2 | 2 | none |
| C | 10 | 1 | 9 | 0 | 11 | 2 | 11 | 2 | 2 | none |
| D | 12 | 1 | 11 | 0 | 14 | 3 | 14 | 3 | 3 | none |
| E | 13 | 1 | 13 | 0 | 17 | 4 | 16 | 3 | 3 | WLn(B2-0) |
| F | 15 | 1 | 15 | 0 | 20 | 5 | 19 | 4 | 4 | WLn(B2-0) |
| G | 17 | 0 | 18 | 1 | 22 | 5 | 21 | 4 | 4 | WLn(B2-0) |

| Data state | PL WLn | PL WLn+1 |
|---|---|---|
| D | 12 | 15 |
| G | 18 | 25 |

D-G difference: 6   10  
WL-WL difference: 4  
Allowable WL-WL difference: 3  
Out of range? Yes 112a4

Fig. 19

| Command | IO7 | IO6 | IO5 | IO4 | IO3 | IO2 | IO1 | IO0 |
|---|---|---|---|---|---|---|---|---|
| XXh | 0 | 0 | True busyn 0: true busy 1: true ready | Defect status for Plane1 0: pass 1: fail | Defect status for Plane0 0: pass 1: fail | Program status for Plane1 0: pass 1: fail | Program status for Plane0 0: pass 1: fail | Program status for chip 0: pass 1: fail |

STATE-BY-STATE PROGRAM LOOP DELTA DETECTION MODE FOR DETECTING A DEFECTIVE MEMORY ARRAY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

FIG. 4 is a perspective view of an example memory die 400 consistent with FIG. 1A, where blocks of memory cells are provided in respective planes Plane0-Plane3, and a meta-block 410 comprises blocks B0-0 to B3-0.

FIG. 5 depicts an example transistor 520 in the memory structure 126 of FIG. 1A.

FIG. 7A depicts an example view of NAND strings in the block B0-0 which is consistent with FIGS. 4 and 6A.

FIG. 7B depicts an example top view of the block B0-0 of FIG. 7A, with respective NAND strings, bit lines and sense circuits.

FIG. 9A depicts threshold voltage (Vth) distributions for data memory cells in an eight-state memory device.

FIG. 9B depicts threshold voltage (Vth) distributions for data memory cells in an eight-state memory device, in a fine portion of a foggy-fine programming technique.

FIG. 11A depicts a comparison between word lines in a single block (B0-0 in Plane0).

FIG. 11B depicts a comparison between word lines in two blocks in a plane (B0-0 and B0-1 in Plane0).

FIG. 11C depicts a comparison between word lines in two blocks in respective planes (B0-0 in Plane0 and B1-0 in Plane1).

FIG. 11D depicts a comparison between word lines in four blocks in respective planes (B0-0 in Plane0, B1-0 in Plane1, B2-0 in Plane2 and B3-0 in Plane0).

FIG. 12 depicts a plot of a number of word lines versus a program loop delta which represents a difference in a number of program loops used by a first word line, in comparison to a second word line, to complete programming to a comparison data state.

FIG. 13A depicts a plot of a correspondence between program loop number and data states which are verified for two word lines, showing an allowable program loop delta, consistent with FIGS. 10 and 12.

FIG. 13B depicts a plot of an allowable program loop delta versus a programmed data state, consistent with FIG. 13A, where the allowable program loop delta is a function of the data state.

FIG. 13C depicts a plot of an allowable program loop delta versus a programmed data state, where the allowable program loop delta is the same for each programmed data state.

FIG. 16A depicts a flowchart of an example process for detecting a defect between word lines based on a program loop delta for one or more programmed data states, consistent with FIG. 14, where the word lines are in different blocks, and the blocks are programmed serially, one at a time.

FIG. 16B depicts a flowchart of an example process for detecting a defect between word lines based on a program loop delta for one or more programmed data states, consistent with FIG. 14, where the word lines are in different blocks, and the blocks are programmed in parallel.

FIG. 18A depicts an example of a program speed comparison table 112a1 which is used to implement the process of FIG. 15, where the word lines are in a single block in a plane, consistent with FIG. 11A.

FIG. 18B depicts an example of a program speed comparison table 112a2 which is used to implement the process of FIG. 16A or 16B, where the word lines are in two blocks in two respective planes, consistent with FIG. 11C.

FIG. 18C depicts an example table of a program speed comparison table 112a3 which is data used to implement the process of FIG. 16A or 16B, where the word lines are in four blocks in four respective planes, consistent with FIG. 11D.

FIG. 18D depicts an example of a program speed comparison table 112a4 which is used to implement the process of FIG. 17, where the word lines are in a single block in a plane, consistent with FIG. 11A.

FIG. 19 depicts a table of commands for implementing the process of FIG. 16A or 16B.

DETAILED DESCRIPTION

Figure 2:
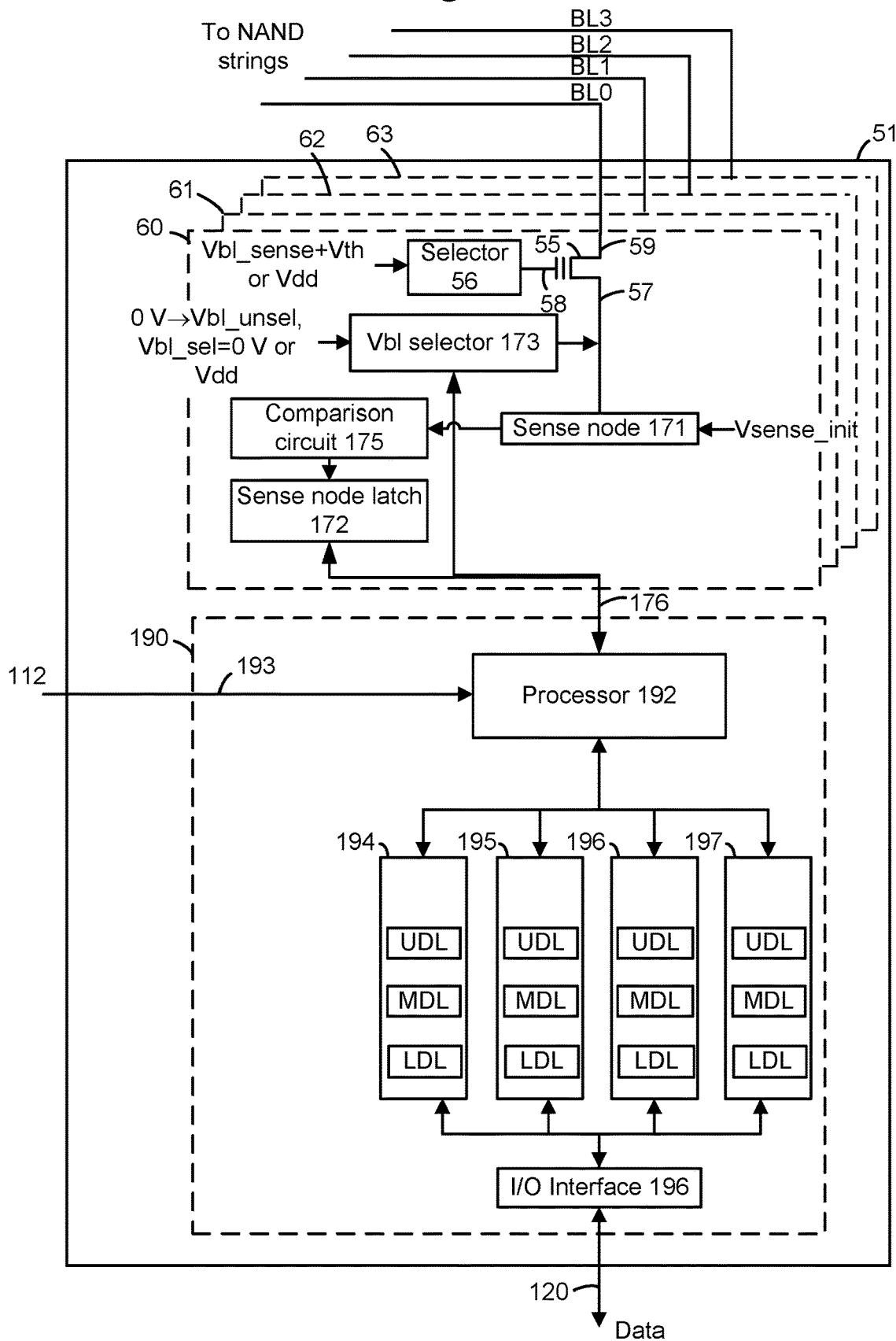
FIG. 2 is a block diagram depicting one embodiment of the sense block 51 of FIG. 1A.

Apparatuses and techniques are described for detecting a defect in a memory array based on a comparison between the program speed of memory cells connected to different word lines.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The memory cells can include data memory cells, which are eligible to store user data, and dummy memory cells, which are ineligible to store user data. Dummy memory cells are used to reduce disturbs of data memory cells by providing buffer regions along the NAND string.

Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extends vertically in the stack. A source end of the NAND string is connected to the substrate and a drain end of the NAND string is connected to a bit line.

In particular, 3D NAND flash memory is widely used for storage in consumer devices, enterprise systems and industrial applications because of its non-volatility, affordability, high storage density and high access speed.

In a 2D memory structure, the memory cells may be arranged in horizontal NAND strings on a substrate.

Data can be stored in the memory cells by programming them to different data states which are represented by different ranges of threshold voltages (Vths). Generally, one or more bits can be stored in each memory cell. For example, eight different data states can be used in a three-bit per cell approach. The data can be arranged in pages, where a page is a minimum unit of data which can be programmed or read. The data states can include an erased state and one or more programmed data states.

During programming, a series of program-verify loops (program loops) are performed for a selected word line. Each program-verify loop is performed by applying a program pulse followed by one or more verify voltages to a selected word line. During each program pulse, programming is enabled for memory cells which have not yet completed programming. For example, the programming of a memory cell in a NAND string can be enabled by setting the respective bit line voltage to 0 V. Also, during each program pulse, programming is inhibited for memory cells which have completed programming, or which are assigned to the erased state and therefore do not undergo programming. For example, the programming of a memory cell in a NAND string can be inhibited by setting the respective bit line voltage to 1-2 V.

During the applying of a verify voltage associated with a data state, the memory cells which are assigned to that data state and which have not previously completed programming are sensed in a verify test to determine whether their Vth exceeds the verify voltage. If the Vth exceeds the verify voltage, the memory cell has successfully completed programming. Typically, the program operation is successful if the programming of all of the data states is completed within a maximum allowable number of program-verify loops.

After the programming is completed, a read operation can be performed to identify the data stored in the memory cells. A read operation can be performed by applying read voltages to the selected word line based on the page of data which is to be read. The read operation is successful if the data can be read without uncorrectable read errors.

However, defects in a word line, block or chip can interfere with the data-storage capabilities of the memory device. In some cases, a defect can cause a read failure, referred to as a silent read failure, which occurs after a successful program operation, resulting in the loss of user data. Such defects can be caused, e.g., by a short circuit between a word line and a memory hole, a short circuit between a word lines, or a leaky select gate transistor.

Some defect detection techniques involve measuring leakage current such as by using an external tester or an on-chip built in self test (BIST) mode at the time of manufacture. However, the efficiency of these techniques is questionable as they may not detect defects which occur after the time of manufacture. Another technique is to read the memory cells immediately after they have been programmed to verify the data integrity. However, this results in a system performance penalty because of the extra time and power consumption.

Techniques provided herein address the above and other issues. In one aspect, a defective memory cell array is detected by comparing the programming speed of memory cells connected to different word lines. The comparison can be performed for one or more programmed data states. In one approach, the comparison involves comparing two word lines in terms of a number of program-verify loops used to complete programming to a programmed data state. This can represent a number of program-verify loops used to transition from the erased state to the programmed data state.

In another approach, the comparison involves comparing two word lines in terms of a number of program-verify loops used to transition memory cells between two programmed data states.

A program loop delta represents the number of program-verify loops used by the slower-programming word line relative to the faster-programming word line. If the program loop delta is not within an allowable range for one or more data states, it can be concluded that a defect is present. The block which has the defect can be identified as a bad block which is no longer used.

In one approach, the comparison is between adjacent word lines in one block, to identify a short circuit between the adjacent word lines. Or, the comparison can be between word lines which a relatively close in a block, such as word lines which are separated by no more than three other word lines. A short circuit between word lines may encompass a few neighboring word lines. In another approach, the comparison is between two or more word lines in different blocks. The different blocks can be in one plane or in different planes. This approach is useful when a program operation program word lines in different planes concurrently or consecutively, such as in a meta block. A comparison can also be made involving more than two word lines. For example, a word line WLn in a first block can be compared to an adjacent word line WLn+1 in the first block and to another word line WLn in a second block. Either comparison can identify a defect. The allowable program loop delta can be different for a comparison between word lines within a block compared to a comparison between word lines in different blocks.

A command sequence which implements the above features is also provided.

The techniques can effectively detect a defective memory array which can lead to a read failure, even when a program operation would be successfully completed in the absence of the defect detection techniques. The technique can be used in the field to reduce the risk of losing user data. The techniques avoid the performance penalty of a post-write read. The techniques can also be used as a screening process in a factory test of the memory device before it is released to the end user.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, including a program speed comparison table 112a (see examples in FIG. 18A-18D), an on-chip address decoder 114, and a power control circuit 115. The table 112a can include latches for storing data.

A storage region 113 may also be provided, e.g., for operational parameters and software/code. In one embodiment, the state machine is programmable by the software. In other embodiments, the state machine does not use software and is completely implemented in hardware (e.g., electrical circuits). The storage region 113 can be used to store optimum time periods which are determined in recovery read operations as described herein.

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. In some cases, uncorrectable read errors can occur which trigger recovery read operations as described herein. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. For example, see FIG. 8. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3 to provide the voltage signals described herein and to implement the techniques discussed herein.

The term "memory die" can refer to a semiconductor die that contains non-volatile memory cells for storage of data.

The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIGS. 7A and 7B, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. A verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vsense+Vth, e.g., 1.5 V, to the control gate of the transistor 55 to provide Vsense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a scan operation, or flipped from 0 to 1 in a fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
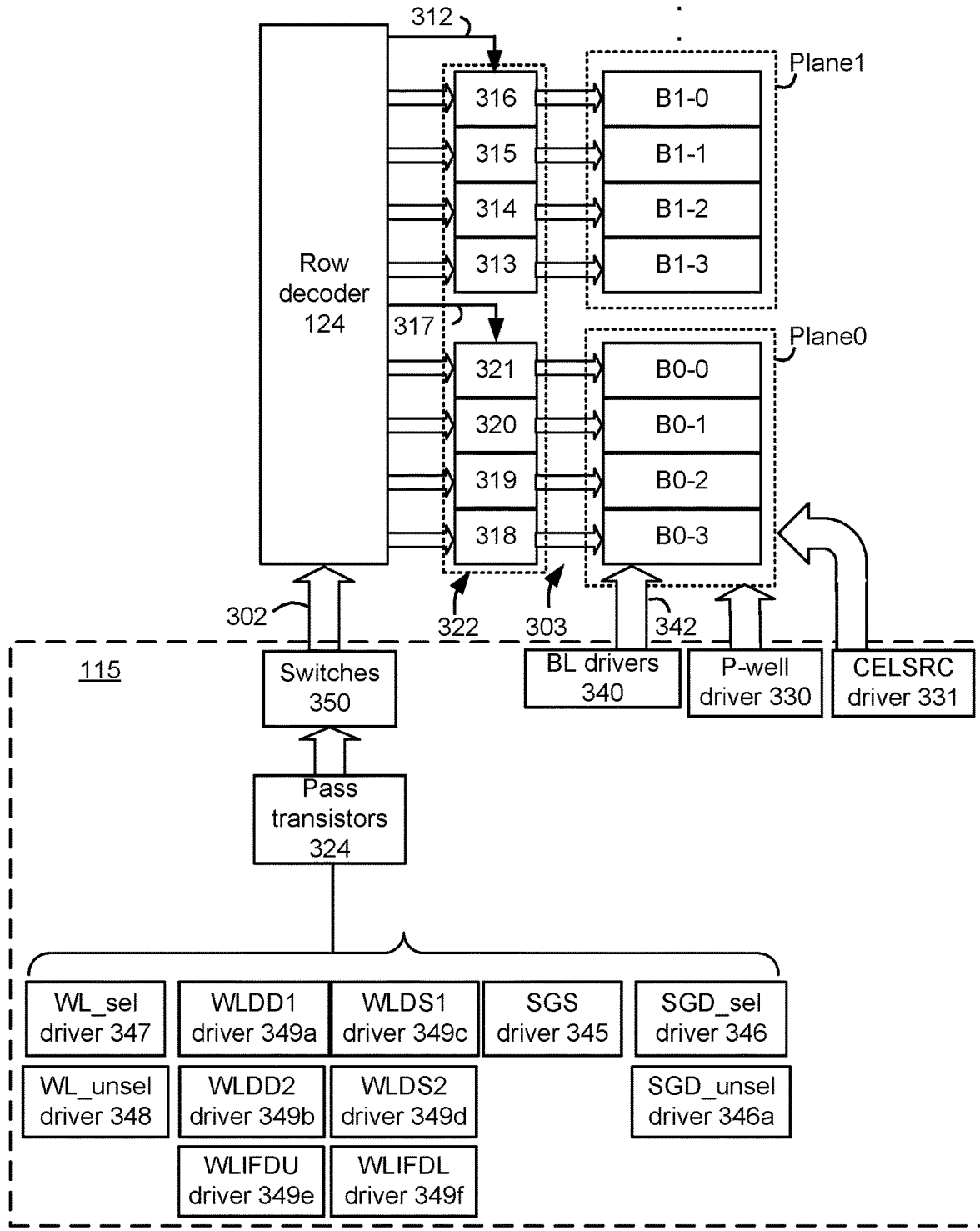
FIG. 3 depicts an example implementation of the power control circuit 115 of FIG. 1A for providing voltages to blocks of memory cells in a plane.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, Plane0, and another set of four blocks, B1-0 to B1-3, in another plane, Plane1, consistent with FIG. 4. Plane2 and Plane3 in FIG. 4 are not depicted in this example. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B1-0 to B1-3, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL sel driver 347, provides a voltage signal on a data word line which is selected during a program or read operation. As described herein, time periods which are allocated for various transitions in voltages can be optimized, e.g. for the WL sel driver 347 and the BL voltage drivers 340.

The WL unsel driver 348 provides a voltage signal on unselected data word lines. A number of drivers for dummy word lines can also be provided. For example, WLDD1, WLDD2, WLDS1, WLDS2, WLIFDU and WLIFDL drivers 349a-349f, respectively, provide a voltage signal on the first drain-side dummy word line WLDD1, the second drain-side dummy word line WLDD2, the first source-side dummy word line WLDS1, the second source-side dummy word line WLDS2, the upper interface dummy word line WLIFDU and the lower interface dummy word line WLIFDL, respectively. See FIGS. 6A and 6B. This is one example, as other examples are possible. In this example, there are two drain-side dummy word lines and two source-side dummy word lines, and two interface dummy word lines, where each dummy word line can receive an independent voltage signal. In another approach, multiple drain-side or source-side dummy word lines have their control gates connected so that they receive a common voltage signal.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+contact 612b in the p-well region 612, e.g., via the conductive path 682. See FIG. 5A. In one approach, the p-well region is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 612c in the p-well region, e.g., via the local interconnect 651 in FIG. 6A.

Bit line (BL) voltage drivers 340 include voltage sources which provide voltages to the bit lines 342. The bit line voltage for sensing can be 0.5 V, for example.

FIG. 4 is a perspective view of an example memory die 400 consistent with FIG. 1A, where blocks of memory cells are provided in respective planes Plane0-Plane3, and a meta-block 410 comprises blocks B0-0 to B3-0. The memory die includes a substrate 401, an intermediate region 402 in which blocks of memory cells are formed, and an upper region 403 in which one or more upper metal layers are patterned such as to form bit lines. Planes Plane0-Plane3 represent respective isolation regions which are formed in the substrate 401. Further, blocks sequences 405, 415, 425 and 435 of a number n blocks, labelled B0-0 to B0-*n*-1, B1-0 to B1-*n*-1, B2-0 to B2-*n*-1 and B3-0 to B3-*n*-1, are formed in Plane0-Plane3, respectively. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. Moreover, the blocks of a meta-block can be read concurrently as a data unit in a multi-plane read operation. Typically, the same selected word line and page type are read in each block, and the read operations can occur concurrently or sequentially. The blocks in a meta-block may contain related data in some cases. The block of a meta-block can be arranged on a common die or extend across multiple die.

Similarly, the blocks of a meta-block can be programmed concurrently as a data unit in a multi-plane program operation.

The substrate 401 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While four planes are depicted as an example, other examples can use fewer, e.g., two, planes or more, e.g., eight, planes. One plane per die is also possible.

While the above example is directed to a 3D memory device with vertically extending NAND strings, the techniques provided herein are also applicable to a 2D memory device in which the NAND strings extend horizontally on a substrate.

Figure 6A:
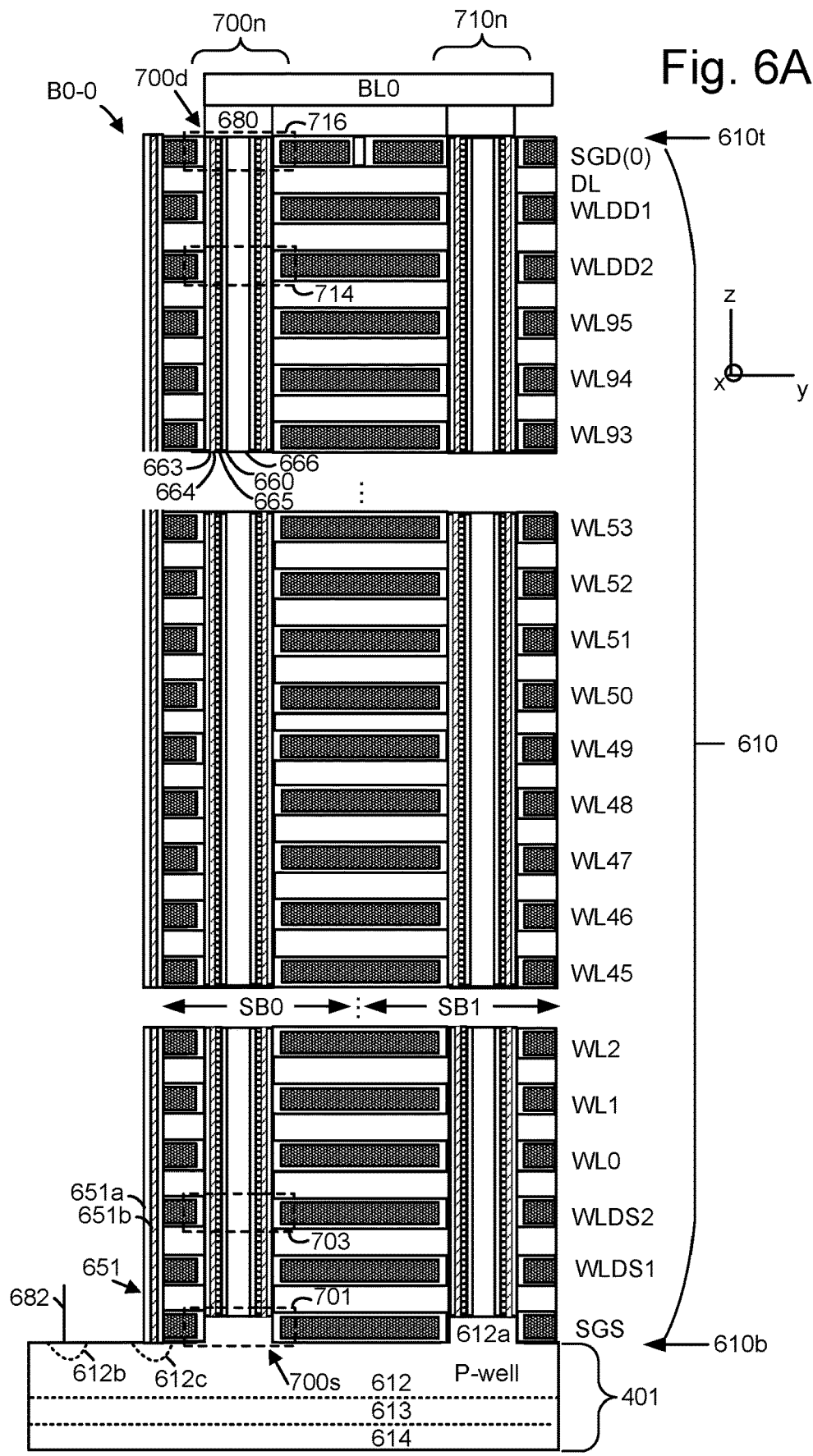
FIG. 6A depicts an example cross-sectional view of a portion of the block B0-0 of FIG. 4, including NAND strings 700n and 710n, in a single-tier stack.

FIG. 5 depicts an example transistor 520 in the memory structure 126 of FIG. 1A. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6A depicts an example cross-sectional view of a portion of the block B0-0 of FIG. 4, including NAND strings 700*n* and 710*n*, in a single-tier stack. In this example, the NAND strings 700*n* and 710*n* are in different sub-blocks SB0 and SB1, respectively, and are connected to a common bit line, BL0. The block comprises a stack 610 of alternating conductive layers (word line layers) and dielectric layers.

The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A controller considers the data memory cells to be eligible to store user data. In this example, the stack includes ninety-six data word lines, WL0-WL95. The data word lines are separated by dielectric layers. DL is an example dielectric layer.

The conductive layers connected to control gates of dummy memory cells are referred to as dummy word lines. Dummy memory cells can have the same construction as data memory cells but are considered by the controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to the interface, above and below the interface. For example, see FIG. 6B, and the upper and lower interface dummy word lines, WLIFDU and WLIFDL, respectively.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 610*t* and bottom 610*b* of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride ($Si_3N_4$) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 401. In one approach, the substrate includes a p-well region 612 (see also FIG. 3) connected to the source ends of the NAND strings. The p-well region may comprise epitaxial regions 612a which extend upward adjacent to the source-side select gate transistors. The p-well region can include an n+ contact 612c connected to a local interconnect 651 for receiving a source line voltage, and a p+ contact 612b connected to a conductive path 682 for receiving a p-well voltage. The local interconnect 651 can comprise a conductive material 651b such as metal surrounded by insulating material 651a to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at a top 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate via the local interconnect 651, causing the electrons to return to the channel from the charge trapping layer.

In this example, the SGS transistors do not include the multiple thin layers 660, 663, 664 and 665.

Figure 6B:
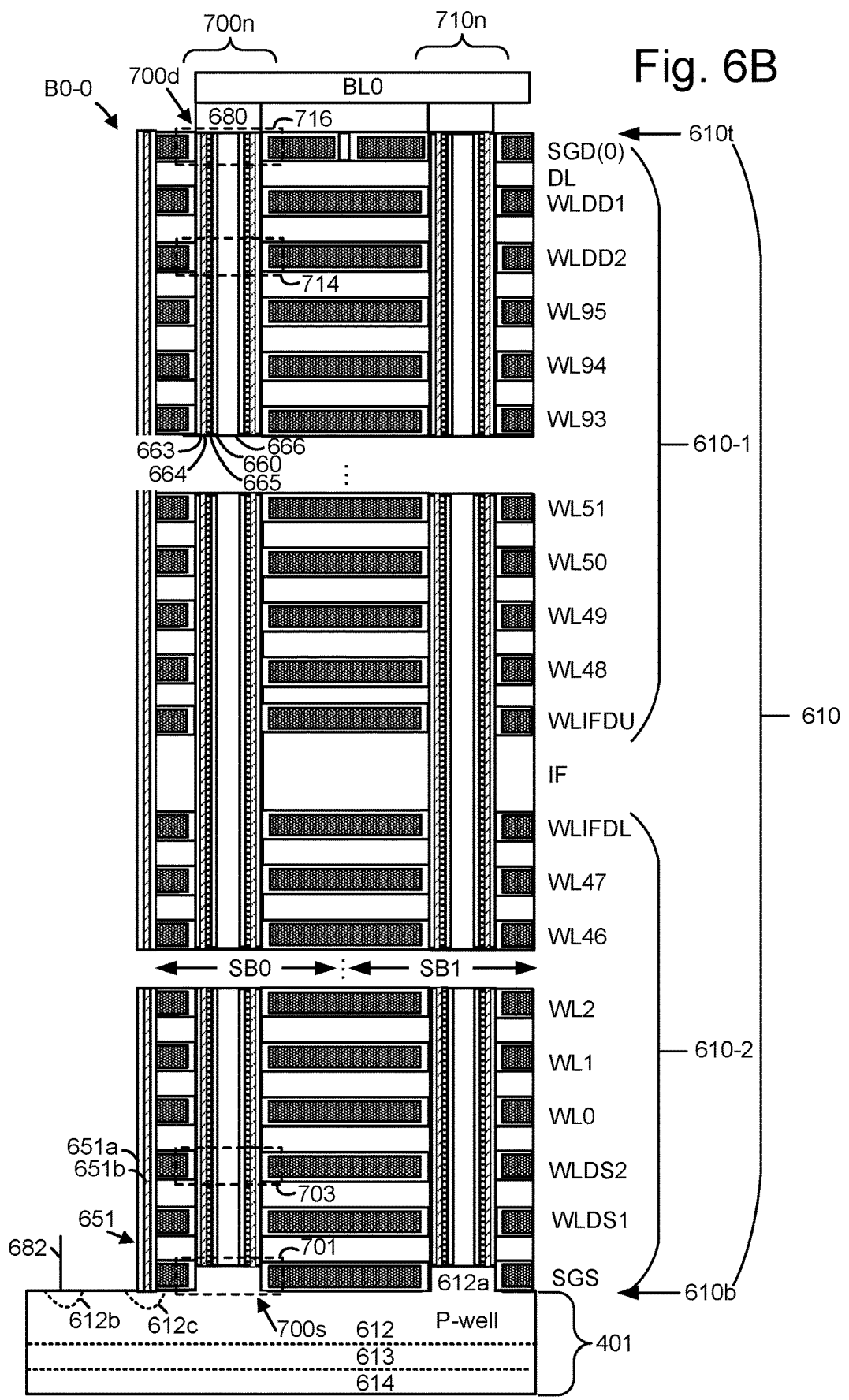
FIG. 6B depicts an example cross-sectional view of a portion of the block B0-0 of FIG. 4, including NAND strings 700n and 710n, in a two-tier stack comprising an upper tier 610-1 and a lower tier 610-2.

FIG. 6B depicts an example cross-sectional view of a portion of the block B0-0 of FIG. 4, including NAND strings 700n and 710n, in a two-tier stack comprising an upper tier 610-1 and a lower tier 610-2. A two-tier other multi-tier stack can be used to form a relatively tall stack while maintaining a relatively narrow memory hole width. After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines.

FIG. 7A depicts an example view of NAND strings in the block B0-0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible.

The plurality of memory cells of B0-0 are arranged in NAND strings, where each NAND string comprising a continuous charge trapping layer along a length of the NAND string. The NAND strings 700n, 710n, 720n and 730n have channels 700a, 710a, 720a and 730a, respectively. Additionally, NAND string 700n includes SGS transistor 701, source-side dummy memory cells 702 and 703, data memory cells 704-713, drain-side dummy memory cells 714 and 715 and SGD transistor 716. NAND string 710n includes SGS transistor 721, source-side dummy memory cells 722 and 723, data memory cells 724-733, drain-side dummy memory cells 734 and 735 and SGD transistor 736. NAND string 720n includes SGS transistor 741, source-side dummy memory cells 742 and 743, data memory cells 744-753, drain-side dummy memory cells 754 and 755 and SGD transistor 756. NAND string 730n includes SGS transistor 761, source-side dummy memory cells 762 and 763, data memory cells 764-773, drain-side dummy memory cell 774 and 775 and SGD transistor 776.

This example depicts one SGD transistor at the drain end of each NAND string, and one SGS transistor at the source end of each NAND string, but multiple SGS and/or SGD transistors could be provided in each NAND string. In one approach, multiple SGD transistors in a NAND string have their control gates connected so that that are driven by a common voltage signal. Multiple SGS transistors in a NAND string can similarly have their control gates connected. The SGD transistors in SB0, SB1, SB2 and SB3 may be driven by separate control lines SGD(0), SGD(1), SGD(2) and SGD(3), respectively, in one approach.

FIG. 7B depicts an example top view of the block B0-0 of FIG. 7A, with respective NAND strings, bit lines and sense circuits. The view is in the x-y plane. Each circle represents a NAND string. In this example, sixteen NAND strings per sub-block are depicted. SB0 includes the NAND string 700n of FIG. 7A and additional NAND strings 700n1-700n15. SB1 includes the NAND string 710n of FIG. 7A and additional NAND strings 710n1-710n15. SB2 includes the NAND string 720n of FIG. 7A and additional NAND strings 720n1-720n15. SB3 includes the NAND string 730n of FIG. 7A and additional NAND strings 730n1-730n15.

A set of bit lines BL0-BL15 are connected to the NAND strings. Each bit line is connected to a respective set of NAND strings, including one NAND string in each sub-block. For example, BL0 is connected to NAND strings 700n, 710n, 720n and 730n in a set of NAND strings 799, BL1 is connected to NAND strings 700n1, 710n1, 720n1 and 730n1, and so forth. Each bit line is also connected to a respective sense circuit, consistent with the sense circuits 60-63 of FIG. 2. For example, BL0-BL15 are connected to sense circuits SC0-SC15, respectively.

Figure 8:
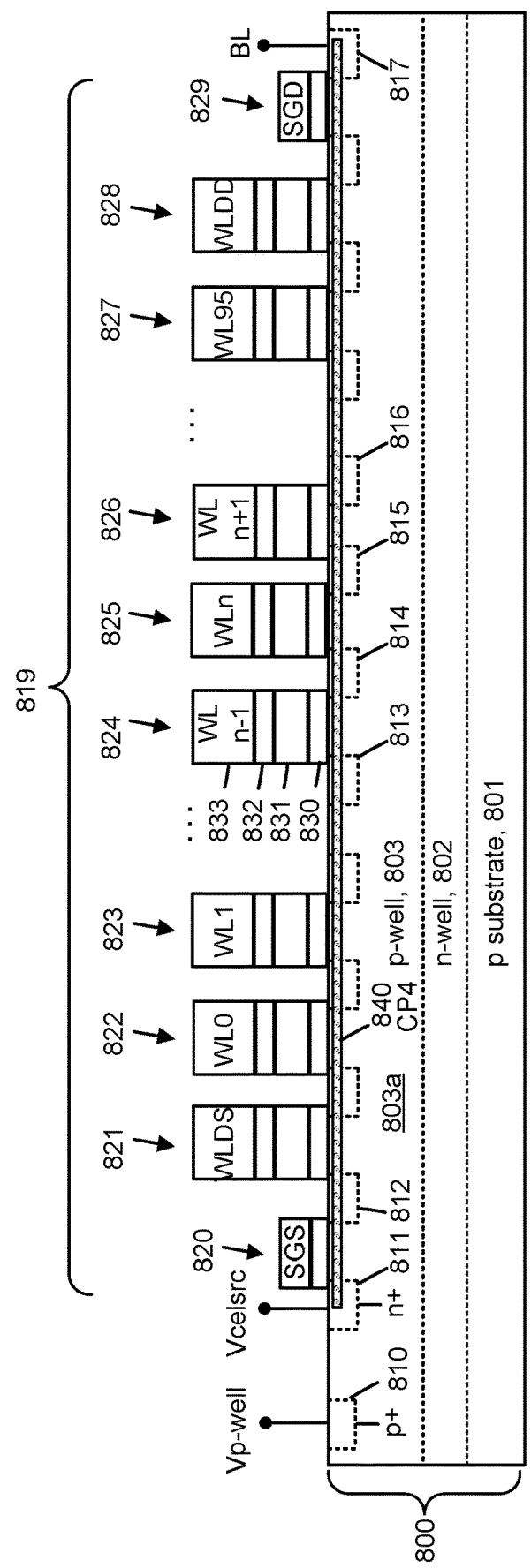
FIG. 8 depicts an example NAND string in a 2D configuration.

FIG. 8 depicts an example NAND string in a 2D configuration. The recovery read techniques discussed herein can be used in a 2D memory device as well as the above-described 3D memory device. The channel in a 2D memory device extends horizontally in the substrate rather than in a vertically extending channel layer. In this example, a substrate 800 includes a p-well 803 within an n-well 802, which in turn is in a p substrate 801. Vp-well and Vcelsrc are provided to the p-well via contacts 810 and 811, respectively. The contact 811 is a source line. The erase pulse can be Vp-well. A NAND string 819 is arranged on the substrate and include select gate transistors and memory cells. For example, the NAND string includes a SGS transistor 820, memory cells 821, 822 and 823 connected to WLDS, WL0 and WL1, respectively, memory cells 824, 825 and 826 connected to WLn–1, WLn and WLn+1, respectively, memory cells 827 and 828 connected to WL95 and WLDD, respectively, and a SGD transistor 829. Doped regions in the substrate, such as example doped regions 811-817, act as sources and drains of the transistors. Vbl is provided to the doped region 817. When appropriate voltages are provided to the NAND string, an inversion layer or channel 840 is formed in the p-well. A remaining portion 803a of the p-well is biased at Vp-well.

The example memory cell 824 comprises a tunneling layer 830, a floating gate layer 831, a blocking oxide layer 832 and a control gate 833.

FIG. 9A depicts threshold voltage (Vth) distributions for data memory cells in an eight-state memory device. Eight data states, or three bits per cell, are depicted as an example. The techniques herein can apply to modes including one or more bits per cell. The vertical axis depicts a number of memory cells on a logarithmic scale and the horizontal axis depicts a threshold voltage on a linear scale. The Vth distributions can represent memory cells connected to a word line. After erasing the block, the Vth distribution 900 is obtained, representing the erased state. The erase operation is completed when the Vth of all, or nearly all, of the data memory cells is below an erase verify voltage, VvEr.

The memory cells are then subject to a programming operation. Each of the memory cells has an assigned data state. Some of the memory cells are assigned to the erased state and are not programmed. Most of the memory cells are programmed to higher states, such as A-F, in this example, as represented by Vth distributions 901-907, respectively. These memory cells are subject to verify tests using verify voltages of VvA-VvG. The data states which are reached by programming, e.g., the A-F states, are referred to as programmed data states. The memory cells which are assigned to a programmed data state complete programming when all, or nearly all, e.g., at least 95-99%, of the memory cells have a Vth greater than the verify voltage. A lockout condition is reached for a memory cell when its Vth is greater than the verify voltage, such that the memory cell passes its verify test.

The memory cells can later be read in a read operation using the A-G state read voltages, VrA-VrG, respectively. A read operation occurs for a page of data and involves one or more read voltages. In one approach, a lower page read involves VrD, a middle page read involves VrF, VrC and VrA, and an upper page read involves VrG, VrE and VrB. In another approach, a lower page read involves VrA and VrE, a middle page read involves VrB, VrD and VrF, and an upper page read involves VrC and VrG.

FIG. 9B depicts threshold voltage (Vth) distributions for data memory cells in an eight-state memory device, in a fine portion of a foggy-fine programming technique. This technique can involve a first program pass in which the memory cells are programmed to a verify voltage which is lower than the final verify voltages of FIG. 9A. A second pass is then used in which the memory cells are programmed to the final verify voltages of FIG. 9A. In this second pass, the Vth is increased at a slower rate than in the first pass. This can be achieved by modifying the program pulse amplitude and/or bit line voltages, for example. A program signal similar to that in FIG. 10 can be used for both the foggy and fine program passes. This technique can result in narrower Vth distributions. The defect detection technique can be used in the foggy or fine pass. Generally, the defect detection technique can be used in any pass of a multi-pass program operation. Once a defect is detected, any remaining passes of the program operation can be skipped.

Figure 10:
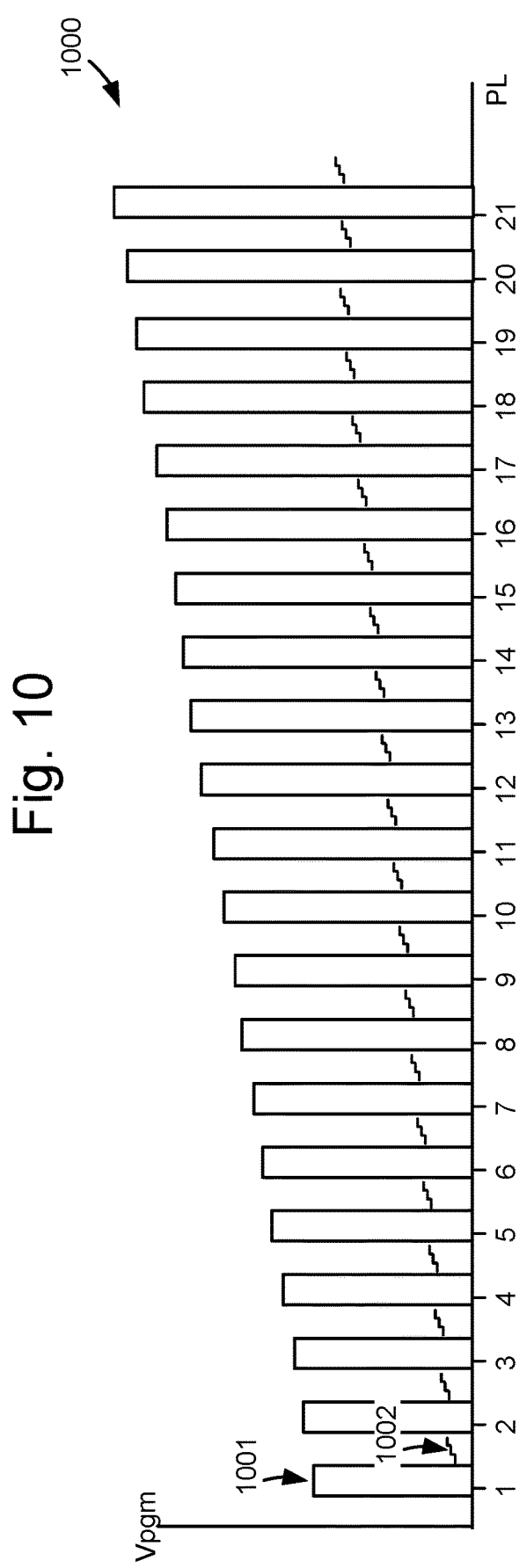
FIG. 10 depicts an example voltage signal 1000 in a program operation, consistent with FIG. 9A.

FIG. 10 depicts an example voltage signal 1000 in a program operation, consistent with FIG. 9A. In this example, the voltage signal includes 22 program-verify loops, PL1-PL22. Each loop includes a program pulse and verify voltages. For example, a program pulse 1001 and verify voltages (plot 1002) are provided in PL1. The verify voltages are depicted in a simplified form, and can be provided for progressively higher data states as the programming proceeds, such as depicted in FIG. 13A. The program pulses may increase in each successive program loop as depicted in a technique referred to as incremental step pulse programming.

FIG. 11A depicts a comparison between word lines in a single block (B0-0 in Plane0). Example word lines WLn to WLn+4 are depicted. The word lines are connected to memory cells in the block. In one example, the word line programming order begins with WL0 and proceeds one word line at a time to the last word line, e.g., WL95. When WLn is programmed, data is stored indicating the program speed of the associated memory cells. This data can indicate a number of program loop used to complete programming to one or more programmed data states referred to as comparison data states. The data can be stored in the tables 112a of FIG. 1A, for example, or in another location. See the example of FIG. 18A.

When WLn+1 is programmed, data is stored indicating the program speed of the associated memory cells. Before programming the next word line WLn+2, a comparison can be made of the number of program loops used to complete programming, for the one or more comparison data states. In one approach, the comparison is made for each programmed data state. The comparison results in a program loop delta for each of the comparison data states. If the program loop delta exceeds a respective threshold, it can be concluded that a defect is present. For example, the number of program loops used to complete programming may be higher for WLn+1 than for WLn. Or, the number of program loops used to complete programming may be higher for WLn than for WLn+1. In either case, it is concluded that the block B0-0 has a defect and it may be marked as a bad block.

Optionally, a comparison is made between the programming speeds of more than two word lines in a block. For example, WLn can be compared to both WLn+1 and WLn+2 is terms of programming speed to one or more comparison data states.

FIG. 11B depicts a comparison between word lines in two blocks in a plane (B0-0 and B0-1 in Plane0). The word lines which are compared are both in the same plane. In one approach, the programming alternates between the blocks.

For example, WLn may be programmed in B0-0, followed by programming WLn in B0-1, followed by programming WLn+1 in B0-0, followed by programming WLn+1 in B0-1, and so forth. It is also possible to program one block partially or completely before programming the other block.

In one example, WLn in B0-0 is programmed and data is stored indicating the program speed of the associated memory cells relative to the comparison data states. WLn in B0-1 is then programmed and data is stored indicating the program speed of the associated memory cells relative to the comparison data states.

Before programming WLn+1 in B0-0, a comparison can be made of the number of program loops used to complete programming for the comparison data states for these two word lines. For example, if the program loop delta exceeds a respective threshold, and the number of program loops used to complete programming is higher for WLn in B0-0 than for WLn in B0-1, it is concluded that B0-0 has a defect and it may be marked as a bad block. B0-1 can continue to be used as a good block.

FIG. 11C depicts a comparison between word lines in two blocks in respective planes (B0-0 in Plane0 and B1-0 in Plane1). As mentioned in connection with FIG. 4, blocks in different planes can be used to store data in a meta-block. In one example, WLn in B0-0 is programmed and data is stored indicating the program speed of the associated memory cells relative to the comparison data states. WLn in B1-0 is then programmed and data is stored indicating the program speed of the associated memory cells relative to the comparison data states. See the example of FIG. 18B.

Before programming WLn+1 in B0-0, a comparison can be made of the number of program loops used to complete programming, for the comparison data states for these two word lines. For example, if the program loop delta exceeds a respective threshold, and the number of program loops used to complete programming is higher for WLn in B0-0 than for WLn in B1-0, it is concluded that B0-0 has a defect and it may be marked as a bad block. B1-0 can continue to be used as a good block.

In another option, if the program loop delta exceeds a respective threshold for one or more comparison data states, and the number of program loops used to complete programming is higher for WLn in B1-0 than for WLn in B0-0, it is concluded that B1-0 has a defect and it may be marked as a bad block. B0-0 can continue to be used as a good block. Additionally, when WLn+1 is programmed in B0-0, the number of program loops used to complete programming for WLn+1 in B0-0 relative to the comparison data states can be compared to the previously-determined number of program loops used to complete programming for WLn in B0-0 relative to the comparison data states. This comparison can indicate whether there is a defect in B0-0. If the comparison indicates the program loop delta exceeds a respective threshold, B0-0 is identified as a defective block. This example shows that a block which is not found to be defective based on one type of comparison, e.g., block to block in different planes, can be found to be defective based on another type of comparison, e.g., within a block.

The first comparison between word lines in different blocks is an example of a horizontal comparison (assuming the blocks are arranged laterally on a substrate) and the second comparison between word lines within a block is an example of a vertical comparison (assuming the word lines are arranged vertically relative to a substrate). This approach involves two WL-WL comparisons. For example, WLn in B0-0 can be compared to WLn in B1-0 in a horizontal comparison and to WLn+1 in B0-0 in a vertical comparison.

In one approach, if one or both comparisons indicate WLn in B0-0 is defective, a defect is declared for B0-0. In another approach, a defect is declared for B0-0 in response to determining that both comparisons indicate WLn in B0-0 is defective. That is, a defect is not declared for B0-0 in response to determining that one of the comparisons indicates WLn in B0-0 is defective and the other comparison indicating WLn in B0-0 is not defective. In these scenarios, WLn in B0-0 is an example of a first word line, WLn in B1-0 is an example of a second word line, and WLn+1 in B0-0 is an example of a third word line. A set of memory cells in the memory array includes memory cells connected to the first, second and third word lines. The first and third word lines are in a first block, and the second word line is in a second block.

Also in this scenario, a control circuit is configured to: program the memory cells connected to the first, second and third word lines to a plurality of programmed data states. And, for at least one comparison data state of the plurality of programmed data states, the control circuit is configured to 1) determine a first difference between a number of program-verify loops used to program memory cells connected to the first word line to the comparison data state, and a number of program-verify loops used to program memory cells connected to the second word line to the comparison data state, and 2) determine a second difference between the number of program-verify loops used to program memory cells connected to the first word line to the comparison data state, and a number of program-verify loops used to program memory cells connected to the third word line to the comparison data state. The control circuit is configured to determine whether the defect is present based on whether the first and/or second differences exceed a respective threshold for the at least one comparison data state.

Further, the respective threshold can be the same or different for the first and/or second differences. In one approach, the respective threshold for triggering a defect is greater for a horizontal comparison than for a vertical comparison based on the theory that word lines in different blocks may have a different performance due to fabrication variations between the blocks. In contrast, word line-to-word line variations in a single block may be smaller than word line-to-word line variation between blocks.

FIG. 11D depicts a comparison between word lines in four blocks in respective planes (B0-0 in Plane0, B1-0 in Plane1, B2-0 in Plane2 and B3-0 in Plane0). This example is an extension of the example of FIG. 11C. As mentioned, blocks in different planes can be used to store data in a meta-block. In one example, WLn in B0-0 is programmed, followed by WLn in B1-0, WLn in B2-0 and WLn in B3-0. Or, the programming can be concurrent. During each program operation, data is stored indicating the program speed of the associated memory cells. See the example of FIG. 18C.

A four-way comparison is then made. In one approach, for each comparison data state, the word line with the lowest number of program loops is identified, and a program loop delta is determined for each of the remaining word lines. If the program loop delta exceeds a respective threshold, the block which exceeds the threshold is identified as a defective block.

Optionally, the decision to declare a defect requires the program loop delta of two or more comparisons to exceed a respective threshold.

FIG. 12 depicts a plot of a number of word lines versus a program loop delta which represents a difference in a number of program loops used by a first word line, in comparison to a second word line, to complete programming to a comparison data state. The plot is provided for an example comparison data state and for different pairs of first and second word lines. The plot could be different for different comparison data states. The plot indicates that the difference in the number of program loops, PL Δ, centers at 0 for most word lines. PL Δ=−1 for a smaller group of the word lines, and PL Δ=−2 or −3 for a much smaller group of the word lines, indicating a first word line is faster programming than a second word line in a comparison.

The plot further indicates that PL Δ=1 for a smaller group of the word lines, and PL Δ=2-6 for a much smaller group of the word lines, indicating the first word line is slower programming than the second word line. In particular, a maximum allowable value or threshold of PL Δ is 3, such that a word line which is slower programming by up to 3 program loops relative to another word line may not be considered to be defective. However, PL Δ=4 or 5 is associated with a likely read failure, such that the slower-programming word line should be considered to be defective. PL Δ=6 or higher is associated with a likely program failure, such as that the slower-programming word line should be considered to be defective. A program failure occurs when the memory cells of a word line do not complete programming to the highest programmed state within a maximum allowable number of program loops.

The threshold, e.g., three program loops, which distinguishes PL Δ values which are likely to result in a read error is relatively high in this example. This provides an effective signal of a defect. For some comparison data states, the threshold may be lower. For example, the threshold may be lower for lower programmed state than for higher programmed state. The threshold may thus be an increasing function of the programmed states and their associated verify voltages. See FIG. 13B, for example. Or, the threshold can be set at a fixed level for each comparison data state. See FIG. 13C, for example.

FIG. 13A depicts a plot of a correspondence between program loop number and data states which are verified for two word lines, showing an allowable program loop delta, consistent with FIGS. 10 and 12. As mentioned in connection with FIG. 10, the verify voltages can be provided for progressively higher data states as the programming proceeds. This approach saves time by avoiding verify tests for data states which are not likely to complete programming in a current program loop. The horizontal bars indicate when the verify tests are performed for each state.

For example, for a first word line, the A state cells complete programming in PL5 and are subject to the respective verify test in PL1-5, the B state cells complete programming in PL7 and are subject to the respective verify test in PL3-7, the C state cells complete programming in PL9 and are subject to the respective verify test in PL5-9, the D state cells complete programming in PL11 and are subject to the respective verify test in PL7-11, the E state cells complete programming in PL13 and are subject to the respective verify test in PL9-13, the F state cells complete programming in PL15 and are subject to the respective verify test in PL11-15, and the G state cells complete programming in PL17 and are subject to the respective verify test in PL13-17.

For a second word line which is compared to the first word line in terms of program speed, the second word line may be slower programming so that each data state completes programming at a later program loop number. The program loop delta values are the thresholds for determining if a defect is present. For example, AΔ=2 indicates the A state cells of the second word line can complete programming as late as PL7, e.g., two program lops after PL5 when the A state cells of the first word line complete programming, without triggering a defect. Similarly, BΔ=2 and CΔ=2 indicate the B and C state cells of the second word line can complete programming as late as PL9 and PL11, respectively, without triggering a defect. DΔ=3 and EΔ=3 indicate the D and E state cells of the second word line can complete programming as late as PL14 and PL16, respectively, without triggering a defect. FΔ=4 and GΔ=4 indicate the F and G state cells of the second word line can complete programming as late as PL19 and PL21, respectively, without triggering a defect.

FIG. 13B depicts a plot of an allowable program loop delta versus a programmed data state, consistent with FIG. 13A, where the allowable program loop delta is a function of the data state. As mentioned, the allowable PLΔ can be 2 for the A-C states, 3 for the D and E states and 4 for the F and G states, as an example.

In this example, the respective threshold of the allowable program loop delta is higher for a higher comparison data state among the multiple programmed data states than for a lower comparison data state among the multiple programmed data states. That is, the respective threshold of the allowable program loop delta is an increasing function of the data state.

FIG. 13C depicts a plot of an allowable program loop delta versus a programmed data state, where the allowable program loop delta is the same for each programmed data state. In this case, the allowable PLΔ is 2 loops for the A-G states. This provides a simpler implementation which is satisfactory in many cases. Note that the program speed of a word line can vary due to factors such as the number of program-erase cycles, temperature, word line position in a stack and variations in the fabrication process. However, these factors will normally be similar for two word lines whose program speeds are being compared, so that the maximum allowable program speed delta which is used to trigger a defect does not have to be adjusted based on these factors.

Figure 14:
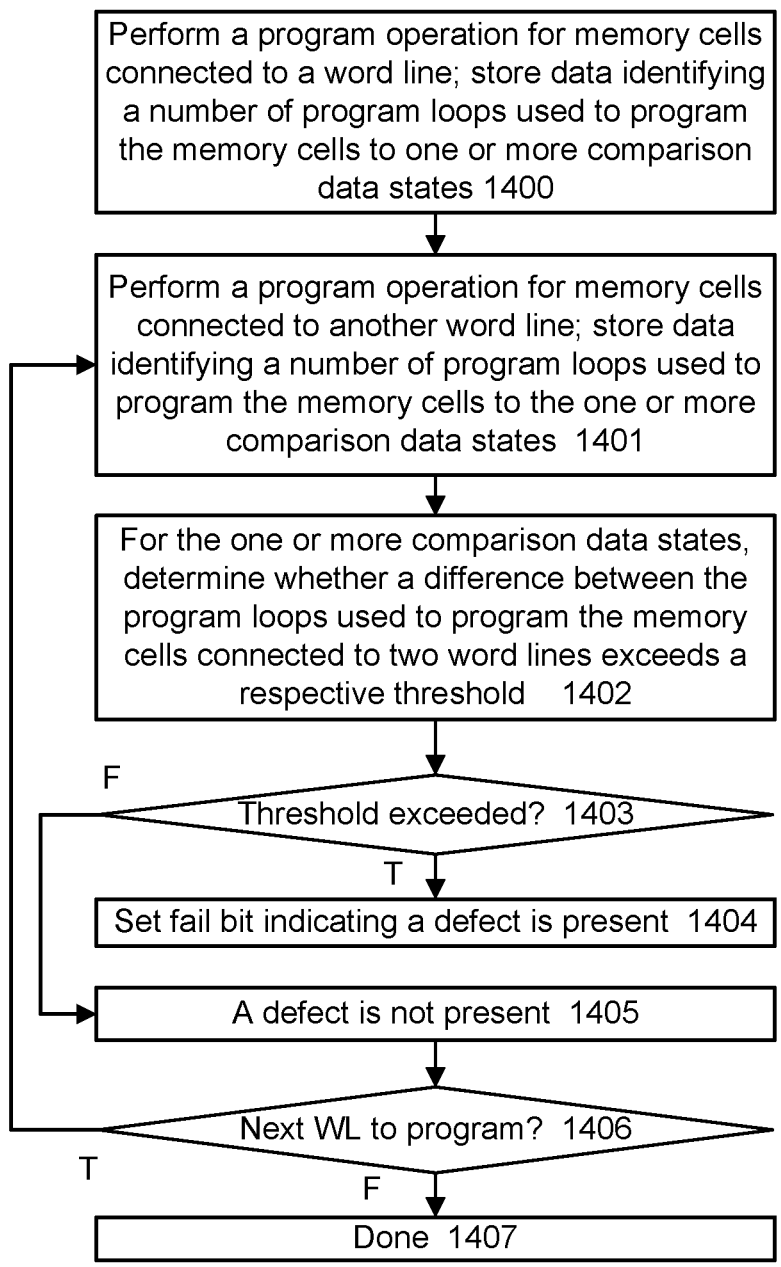
FIG. 14 depicts a flowchart of an example process for detecting a defect between word lines based on a program loop delta for one or more programmed data states.

FIG. 14 depicts a flowchart of an example process for detecting a defect between word lines based on a program loop delta for one or more programmed data states. Step 1400 includes performing a program operation for memory cells connected to a word line (e.g., WL0); and storing data identifying a number of program loops used to program the memory cells to one or more comparison data states, e.g., starting from the erase state. The comparison data states are data states among the plurality of programmed data states. By using comparison data states among the programmed data states, there is no time penalty or need for extra verify tests. Optionally, it is possible to detect the number of program loops used to program the memory cells to a specified Vth which is not the verify voltage of a data state and to use this as a comparison between word lines.

Step 1401 includes performing a program operation for memory cells connected to another word line (e.g., WL1); and storing data identifying a number of program loops used to program the memory cells to the one or more comparison data states, e.g., starting from the erase state. Step 1402 includes, for the one or more comparison data states, determining whether a difference between the program loops used to program the memory cells connected to two word lines exceeds a respective threshold.

In one approach, the determination of whether a threshold is exceeded can be performed after the program operation is successfully completed for the two word lines being compared, e.g., after the memory cells connected to the word lines have been programmed to their assigned data states. In another approach, the determination of whether a threshold is exceeded can be performed after programming is successfully completed for each comparison data state, but the program operation can be terminated if the threshold is exceeded, without completing the program operation.

In one approach, multiple comparison data states are used which are in the upper half of a plurality of programmed data states. For example, if the programmed data states are A-G, the upper half of the programmed data states comprises the states E-G. This approach takes advantage of the fact that a defect can be detected with greater reliability for the higher states.

If a decision step 1403 is true (T), such that the threshold is exceeded, step 1404 sets a fail bit indicating a defect is present and the process ends. If the decision step 1403 is false (F), such that the threshold is not exceeded, step 1405 indicates a defect is not present. The decision to trigger a defect can be based on a program loops delta which exceeds a threshold for a single comparison data state or multiple comparison data states. A decision step 1406 determines whether there is a next WL to program. If the decision step 1406 is false, the program operation is done at step 1407. If the decision step 1406 is true, step 1401 is repeated for another word line (e.g., WL2).

Figure 15:
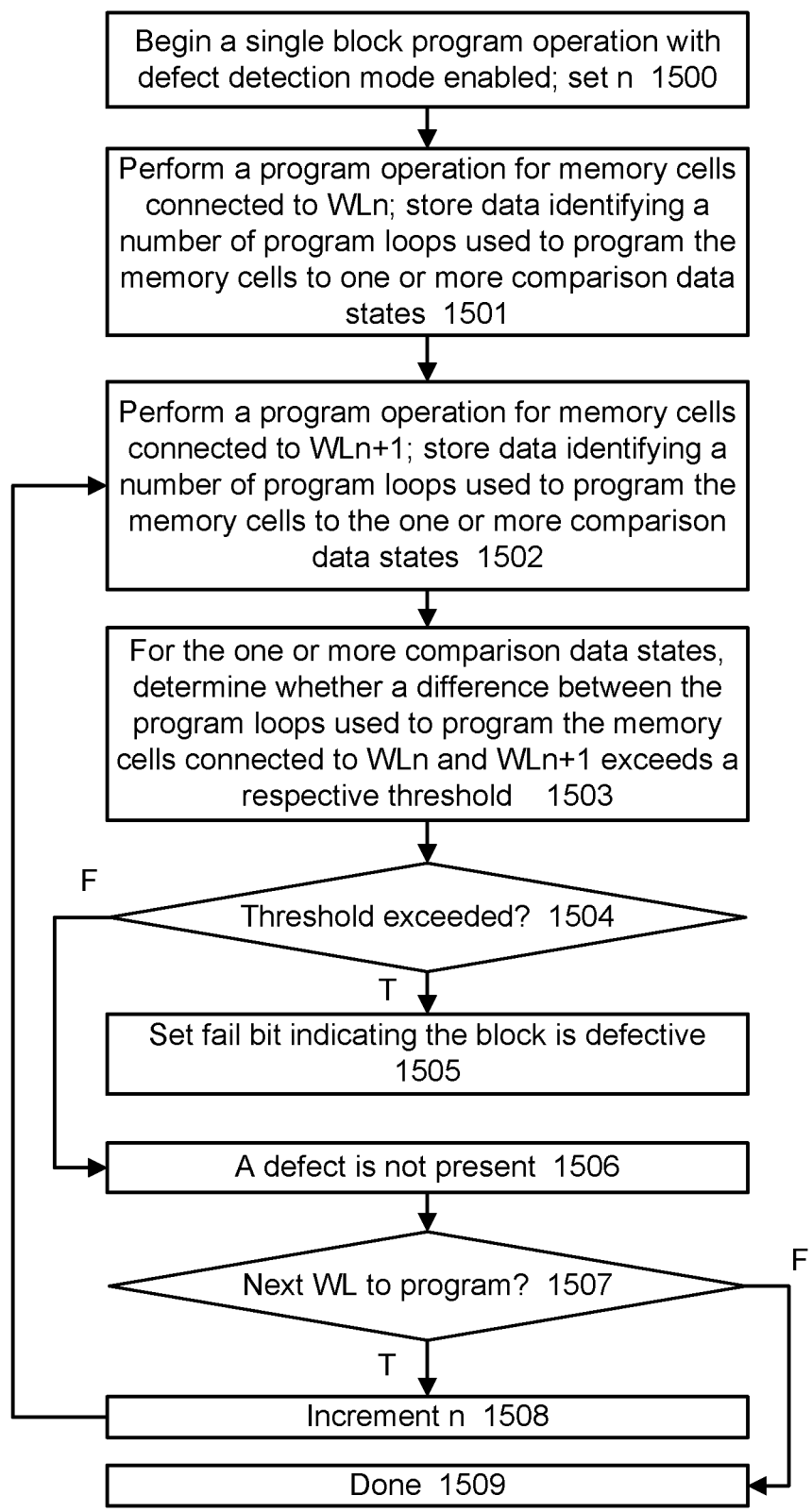
FIG. 15 depicts a flowchart of an example process for detecting a defect between word lines based on a program loop delta for one or more programmed data states, consistent with FIG. 14, where the word lines are in a single block.

FIG. 15 depicts a flowchart of an example process for detecting a defect between word lines based on a program loop delta for one or more programmed data states, consistent with FIG. 14, where the word lines are in a single block. Step 1500 begins a single block program operation with a defect detection mode enabled; and sets a word line index n to an initial value (e.g., n=0 for WL0). Step 1501 includes performing a program operation for memory cells connected to WLn; and storing data identifying a number of program loops used to program the memory cells to one or more comparison data states. Step 1502 includes performing a program operation for memory cells connected to WLn+1; and storing data identifying a number of program loops used to program the memory cells to the one or more comparison data states.

Step 1503 includes, for the one or more comparison data states, determining whether a difference between the program loops used to program the memory cells connected to WLn and WLn+1 exceeds a respective threshold. A decision step 1504 determines whether the threshold is exceeded. If the decision step is true, step 1505 sets a fail bit indicating the block is defective and the process is done. If the decision step is false, step 1506 indicates a defect is not present and a decision step 1507 determines whether there is a next WL to program. If the decision step 1507 is false, the program operation is done at step 1509. If the decision step 1507 is true, the word line index n is incremented at step 1508 and step 1502 is repeated for another word line.

FIG. 16A depicts a flowchart of an example process for detecting a defect between word lines based on a program loop delta for one or more programmed data states, consistent with FIG. 14, where the word lines are in different blocks, and the blocks are programmed serially, one at a time. Step 1600 begins a serial multi-block program operation with a defect detection mode enabled. Step 1601 sets a block index i=0 and a word line index n to an initial value. Step 1602 includes performing a program operation for memory cells connected to WLn in block B(i); and storing data identifying a number of program loops used to program the memory cells to one or more comparison data states. Step 1603 includes performing a program operation for memory cells connected to WLn in block B(i+1); and storing data identifying a number of program loops used to program the memory cells to the one or more comparison data states.

A decision step 1604 determines whether there is a next block to program. If the decision step is true, the block index i is incremented at step 1605 and step 1603 is repeated for the next block. If the decision step 1604 is false, step 1606 includes, for the one or more comparison data states, determining whether a difference between the program loops used to program the memory cells connected to WLn in the blocks exceeds a respective threshold. If the threshold is exceeded at the decision step 1607, step 1608 sets a fail bit indicating that a block in which WLn exceeds the threshold is defective and the process is done. If the decision step 1607 is false, step 1609 indicates a defect is not present and a decision step 1610 determines whether there is a next WL to program. If the decision step 1610 is false, the program operation is done at step 1612. If the decision step 1610 is true, the word line index n is incremented at step 1611 and step 1602 is repeated for another word line.

FIG. 16B depicts a flowchart of an example process for detecting a defect between word lines based on a program loop delta for one or more programmed data states, consistent with FIG. 14, where the word lines are in different blocks, and the blocks are programmed in parallel.

Step 1620 begins a parallel multi-block program operation with a defect detection mode enabled. Step 1621 sets a word line index n to an initial value. Step 1622 includes, for each block, performing a program operation for memory cells connected to WLn, and storing data identifying a number of program loops used to program the memory cells to one or more comparison data states.

Step 1623 includes, for the one or more comparison data states, determining whether a difference between the program loops used to program the memory cells connected to WLn in the blocks exceeds a respective threshold. If the threshold is exceeded at the decision step 1624, step 1625 sets a fail bit indicating that a block in which WLn exceeds the threshold is defective and the process is done. If the decision step 1624 is false, step 1626 indicates a defect is not present and a decision step 1627 determines whether there is a next WL to program. If the decision step 1627 is false, the program operation is done at step 1629. If the decision step 1627 is true, the word line index n is incremented at step 1628 and step 1622 is repeated for another word line.

Figure 17:
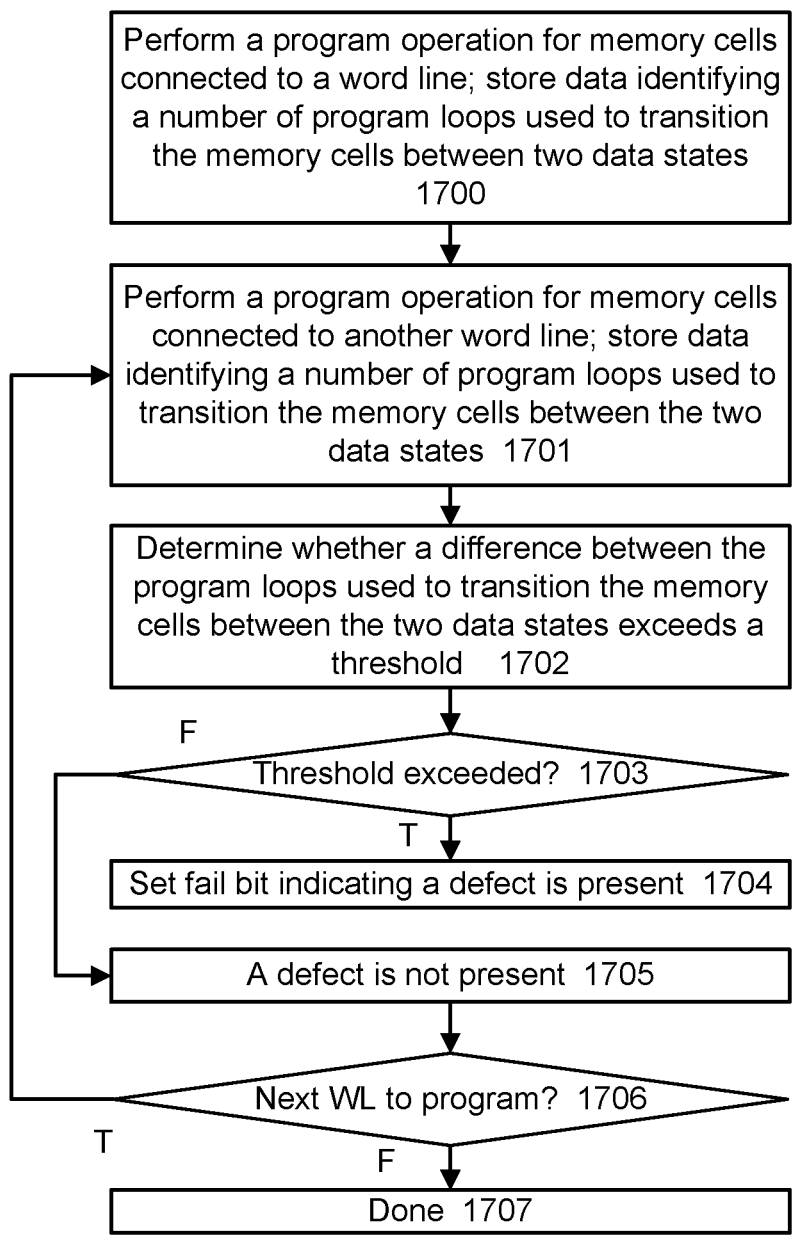
FIG. 17 depicts a flowchart of another example process for detecting a defect between word lines based on a program loop delta for one or more programmed data states, where the program loop delta is based on a number of program loops used to transition between programmed data states.

FIG. 17 depicts a flowchart of another example process for detecting a defect between word lines based on a program loop delta for one or more programmed data states, where the program loop delta is based on a number of program loops used to transition between programmed data states. This is in contrast to a program loop delta based on a number of program loops used to transition between the erased state and a programmed data state.

Step 1700 includes performing a program operation for memory cells connected to a word line; and storing data identifying a number of program loops used to transition (program) the memory cells between two data states (e.g., the D and G states), e.g., among a plurality of programmed data states. Optionally, it is possible to detect the number of program loops used to transition the memory cells between two specified Vths which are not necessarily verify voltages of a data state. Step 1701 includes performing a program operation for memory cells connected to another word line; and storing data identifying a number of program loops used to transition the memory cells between the two data states.

Step 1702 includes determining whether a difference between the program loops used to transition the memory cells between the two data states exceeds a threshold. A decision step 1703 determines whether the threshold is exceeded. If the decision step is true, step 1704 sets a fail bit indicating the block is defective and the process is done. If the decision step is false, step 1705 indicates a defect is not present and a decision step 1706 determines whether there is a next WL to program. If the decision step 1706 is false, the program operation is done at step 1707. If the decision step 1706 is true, step 1701 is repeated for another word line.

Another option is to compare the number of program-verify loops used for multiple transitions of memory cells between two programmed data states e.g., a first transition from the A state to the D state and a second transition from the D state to the G state, or a second transition from the E state to the G state. In one approach, if one or both of the transitions use more than a threshold number of program loops, a defect is declared. In another approach, the triggering of a defect requires both of the transitions to use more than a threshold number of program loops.

In FIG. 18A-18D, the program speed comparison tables 112a1-112a4 are example implementations of the table 112a of FIG. 1A.

FIG. 18A depicts an example of a program speed comparison table 112a1 which is used to implement the process of FIG. 15, where the word lines are in a single block in a plane, consistent with FIG. 11A. The tables of FIG. 18A-18D are examples of a data structure which can be used to store data for implementing the defect detection techniques discussed herein. These examples involve a memory device with eight data states and three bits per cell, although other options are possible. Generally, one or more bits per cell may be used.

The table can be updated by the state machine or other control circuit during a program operation. For example, when programming to one or more comparison data states is completed for one word line, the number of program-verify loops (PL) used to complete the programming is recorded. When programming to the one or more comparison data states is completed for another word line, the number of program-verify loops used to complete the programming is recorded. A program loop delta is then determined between the two word lines for each comparison data state. The program loop delta is compared to an allowable delta or threshold to determine if the delta is out of range, indicating the presence of a defect.

In the table, each of the programmed data states A-G is a comparison data state. For example, the A state is a first comparison data state, the B state is a second comparison data state and so forth. To provide a simpler implementation, the comparison data states can comprise only a subset of the programmed data states. For example, the D and G states could be used.

For a first word line WLn, the number of program loops PL(WLn) used to complete programming to the A, B, C, D, E, F and G states is 6, 8, 10, 12, 14, 16 and 18, respectively. For a second word line WLn+1, the number of program loops PL(WLn+1) used to complete programming to the A, B, C, D, E, F and G states is 8, 10, 12, 15, 18, 21 and 23, respectively. WLn is the faster programming word line of the two word lines which are compared. In the table, the program loop number which is lower for each state is underlined. The program loop delta, |PL(WLn+1)−PL(WLn)|, for the A, B, C, D, E, F and G states is 2, 2, 2, 3, 4, 5 and 5, respectively. The allowable program loop delta for the A, B, C, D, E, F and G states is 2, 2, 2, 3, 3, 4 and 4, respectively. The program deltas are therefore out of range, or exceed the respective threshold, for the E, F and G states. The block can therefore be declared to be defective.

FIG. 18B depicts an example of a program speed comparison table 112a2 which is used to implement the process of FIG. 16A or 16B, where the word lines are in two blocks in two respective planes, consistent with FIG. 11C. In this example, the word lines whose program speeds are compared have the same relative positions or word line number within their respective block. For example, WL0 in a first block, B0-0, can be compared to WL0 in a second block, B1-0. Other options are possible. The word lines which are compared in the different blocks may store data in a meta block, in one option.

In the table, each of the programmed data states A-G is a comparison data state. For a first word line WLn in B0-0, the number of program loops used to complete programming to the A, B, C, D, E, F and G states is 6, 8, 10, 12, 13, 15 and 17, respectively. For a second word line WLn in B1-0, the number of program loops used to complete programming to the A, B, C, D, E, F and G states is 5, 7, 9, 11, 13, 15 and 18, respectively. WLn in B1-0 is the faster programming word line of the two word lines which are compared, for the A-F states. However, WLn in B0-0 is the faster programming word line of the two word lines which are compared, for the G state. In the table, the program loop number which is lower for each state is underlined. In this case, a program loop delta $\Delta 0$ is maintained for B0-0 and a program loop delta $\Delta 0$ is maintained for B0-0. $\Delta 0$ is 1 for each of the A-F states, indicating WLn in B0-0 is slower than WLn in B1-0 by one program loop for these data states. $\Delta 1$ is 1 for the G state, indicating WLn in B1-0 is slower than WLn in B0-0 by one program loop for this data state. The deltas are relative to the fastest programming word line for each data state.

The allowable program loop delta for the A, B, C, D, E, F and G states is 2, 2, 2, 3, 3, 4 and 4, respectively. The program loop deltas are not out of range, and do not exceed the respective threshold, for any of the programmed states. The blocks B0-0 and B1-0 can therefore be maintained as good blocks which are not defective.

FIG. 18C depicts an example table of a program speed comparison table 112a3 which is data used to implement the process of FIG. 16A or 16B, where the word lines are in four blocks in four respective planes, consistent with FIG. 11D. In this example, the word lines whose program speeds are compared have the same relative positions or word line number within their respective block. For example, a comparison can be made between the program speeds of WL0 in each of the four blocks B0-1 to B3-0. The word lines which are compared in the different blocks may store data in a meta block, in one option.

In the table, each of the programmed data states A-G is a comparison data state. For WLn in B0-0, the number of program loops used to complete programming to the A, B, C, $\Delta$ For WLn in B1-0, the number of program loops used to complete programming to the A, B, C, D, E, F and G states is 5, 7, 9, 11, 13, 15 and 18, respectively. These values are consistent with the example of FIG. 18B. WLn in B1-0 is the fastest programming word line of the four word lines which are compared, for the A-F states. However, WLn in B0-0 is the fastest programming word line of the four word lines which are compared, for the G state. In the table, the program loop number which is lowest for each state is underlined.

Program loop deltas $\Delta 0$ to $\Delta 3$ are maintained for B0-0 to B3-0, respectively. The deltas are relative to the fastest programming word line for each data state. $\Delta 0$ is 1 for each of the A-F states, indicating WLn in B0-0 is slower than WLn in B1-0 by one program loop for these data states. $\Delta 1$ is 1 for the G state, indicating WLn in B1-0 is slower than WLn in B0-0 by one program loop for this data states. Δ2 is 2, 2, 2, 3, 4, 5 and 5 for the A, B, C, D, E, F and G states, respectively. Δ3 is 2, 2, 2, 3, 3, 4 and 4 for the A, B, C, D, E, F and G states, respectively. The allowable program loop delta for the A, B, C, D, E, F and G states is 2, 2, 2, 3, 3, 4 and 4, respectively. The program loop deltas are not out of range, and do not exceed the respective threshold, for the A-D states. However, for the E-G states, the program loop deltas are out of range for WLn in B2-0. This block can therefore be identified as a defective block, while the remaining blocks, B0-0, B1-0 and B3-0 are maintained as good blocks.

FIG. 18D depicts an example of a program speed comparison table 112a4 which is used to implement the process of FIG. 17, where the word lines are in a single block in a plane, consistent with FIG. 11A. This example involves comparing the program speed of two word lines based on the number of program loops used to transition the memory cells between the D state and the G state. This can involve determining the number of program loops used to complete programming to the D and G states, and determining a difference between these numbers. This is a number of program loops to complete the transition between the two states.

When programming WLn, it is determined that 12 and 18 program loops are used to complete programming to the D and G states, respectively. The number of program loops to complete the transition between the two states is the difference between these two numbers (the D–G difference), e.g., 18−12=6. When programming WLn+1, it is determined that 15 and 25 program loops are used to complete programming to the D and G states, respectively. The number of program loops to complete the transition between the two states is the difference between these two numbers (the D–G difference), e.g., 25−15=10. Further, the WL-WL difference is 10−6=4, where WLn is the faster programming word line. This is the difference between the number of program loops to complete the transition between the two states. The allowable WL-WL difference is 3 in this example, so that the difference is out of range. The block can therefore be identified as being defective.

FIG. 19 depicts a table of commands for implementing the process of FIG. 16A or 16B. Two example techniques are provided for triggering the defect detection process. A first technique involves a control circuit issuing a prefix command and an automatic program command. A second technique involves activating a device mode. The commands can be provided for a vertical comparison between word lines, e.g., in a common block, or a horizontal comparison between word lines, e.g., in different blocks. The example commands are for TLC programming, with three bits per cell, consistent with FIG. 9A, and QLC programming, with four bits per cell. The commands also encompass foggy-fine programming such as discussed in connection with FIG. 9B.

1. TLC program mode with vertical WL defect detection mode enabled
Prefix CMD1-01h-80h-adddress (5 cycle)-data in-1Ah=>Busy->Ready
Prefix CMD1-02h-80h-adddress (5 cycle)-data in-1Ah=>Busy->Ready
Prefix CMD1-03h-80h-adddress (5 cycle)-data in-10h=>Busy->Ready 2. QLC program mode with vertical WL defect detection mode enabled Foggy portion
Prefix CMD1-0Dh-01h-80h-adddress (5 cycle)-data in-1Ah=>Busy->Ready
Prefix CMD1-0Dh-02h-80h-adddress (5 cycle)-data in-1Ah=>Busy->Ready
Prefix CMD1-0Dh-03h-80h-adddress (5 cycle)-data in-1Ah=>Busy->Ready
Prefix CMD1-0Dh-04h-80h-adddress (5 cycle)-data in-10h=>Busy->Ready Fine portion
Prefix CMD1-01h-80h-adddress (5 cycle)-data in-1Ah=>Busy->Ready
Prefix CMD1-02h-80h-adddress (5 cycle)-data in-1Ah=>Busy->Ready
Prefix CMD1-03h-80h-adddress (5 cycle)-data in-1Ah=>Busy->Ready
Prefix CMD1-04h-80h-adddress (5 cycle)-data in-10h=>Busy->Ready In the above, "Prefix CMD1" is the prefix command. A prefix command is a command which precedes another related command. The prefix command can have a desired format and comprise one or more bytes, for instance. 0Dh denotes a first program pass. 01h-04 denote first through fourth pages of data, respectively. 80h denotes a program operation. The 5 cycle address of the memory cells being programmed comprises bytes for start and end column address such as to define the memory cells of an entire word line or part of a word line, and bytes for row/WL and block address.

"Data in" denotes the page of data to be programmed. 1Ah indicates that an additional page of data will be transmitted. "Busy" indicates the state machine then enters a busy mode while the page of data is received, and "ready" indicates the state machine then returns to a ready mode, in which it can receive the next command sequence. A ready/busy pin of the chip on which the memory array is located can have the busy or ready status as seen by an external controller. 10h indicates that the program operation can start.

3. TLC program mode with horizonal WL defect detection mode enabled
Prefix CMD2-2A-01h-80h-adddress (5 cycle)-data in-1Ah=>Busy->Ready
Prefix CMD2-2A-02h-80h-adddress (5 cycle)-data in-1Ah=>Busy->Ready
Prefix CMD2-2A-03h-80h-adddress (5 cycle)-data in-10h=>Busy->Ready 4. QLC program mode with horizonal WL defect detection mode enabled Foggy portion
Prefix CMD2-2A-0Dh-01h-80h-adddress (5 cycle)-data in-1Ah=>Busy->Ready
Prefix CMD2-2A-0Dh-02h-80h-adddress (5 cycle)-data in-1Ah=>Busy->Ready
Prefix CMD2-2A-0Dh-03h-80h-adddress (5 cycle)-data in-1Ah=>Busy->Ready
Prefix CMD2-2A-0Dh-04h-80h-adddress (5 cycle)-data in-10h=>Busy->Ready Fine portion
Prefix CMD2-2A-01h-80h-adddress (5 cycle)-data in-1Ah=>Busy->Ready
Prefix CMD2-2A-02h-80h-adddress (5 cycle)-data in-1Ah=>Busy->Ready
Prefix CMD2-2A-03h-80h-adddress (5 cycle)-data in-1Ah=>Busy->Ready
Prefix CMD2-2A-04h-80h-adddress (5 cycle)-data in-10h=>Busy->Ready In the above, "Prefix CMD2" is the prefix command and "2A" indicates a horizontal comparison is made. The remaining commands are defined as discussed above.

In the first column of the table of FIG. 19, a dedicated status return command (CMD) XXh) can be used by a control circuit to read out the result of the defect detection process in addition to a program status return.

IO0-IO7 denote input/output bytes. These are bytes which can be transmitted from the control circuitry 110 to the controller 122, for example, to report statuses of the program operation and defect detection process. 100 denotes a pass or fail status of a program operation for data memory cells in a chip. Generally, blocks in multiple planes can be programmed concurrently. If any of the blocks fails to successfully complete the program operation, a status return byte is set to 1 to denote a fail status. If all blocks successfully complete the program operation, a status return byte is set to 0 to denote a pass status.

IO1 denotes a pass or fail status of a program operation for data memory cells of a block in a plane 0 (e.g., Plane0 in FIG. 4). 102 denotes a pass or fail status of a program operation for data memory cells of a block in a plane 1 (e.g., Plane1 in FIG. 4). In both cases, a status return byte is set to 0 or 1 to denote a pass or fail status, respectively.

The statuses of IO0-IO2 are separate from the defect detection status.

IO3 and IO4 denote a pass or fail status of the defect detection process in plane 0 or plane 1, respectively. A status return byte is set, e.g., to 0 or 1 to denote a pass (no defect) or fail (defect) status, respectively.

IO5 denotes a true busy status as busy or ready based on a value of 0 or 1, respectively. This indicates whether the chip is busy and cannot accept commands, or is ready to accept commands.

IO6 and IO7 have a value of 0 and are not used in this example.

This table is an example only and various modifications are possible. For example, if the defect detection process involves four blocks such as in FIG. 11D, two additional bytes can be used for the pass/fail status of planes 2 and 3 in addition to those depicted for planes 0 and 1.

As mentioned, a second example technique for triggering the defect detection process is a device mode. The parameters listed below can be used to enable the defect detection process during a program operation:

F_PD_EN_V: Enable defect detection process between vertically adjacent WLs, in a single block; and.

F_PD_EN_H: Enable defect detection process between horizontally adjacent WLs, in different blocks.

As with the first technique, a dedicated status return command (CMD XXh) can be used to read out the defect detection result in addition to the program status return, as depicted in the table. In addition to the two above-mentioned techniques for triggering the defect detection process, the below parameters can be defined to assist in this defect detection mode. These parameters represent the threshold or maximum allowable program loop delta (PLD) for detecting a defect:

F_PLD_V_delta_A: A state threshold for vertically adjacent WLs;

F_PLD_V_delta_B: B state threshold for vertically adjacent WLs;

F_PLD_V_delta_C: C state threshold for vertically adjacent WLs;

F_PLD_V_delta_D: D state threshold for vertically adjacent WLs;

F_PLD_V_delta_E: E state threshold for vertically adjacent WLs;

F_PLD_V_delta_F: F state threshold for vertically adjacent WLs;

F_PLD_V_delta_G: G state threshold for vertically adjacent WLs;

F_PLD_H_delta_A: A state threshold for horizontally adjacent WLs;

F_PLD_H_delta_B: B state threshold for horizontally adjacent WLs;

F_PLD_H_delta_C: C state threshold for horizontally adjacent WLs;

F_PLD_H_delta_D: D state threshold for horizontally adjacent WLs;

F_PLD_H_delta_E: E state threshold for horizontally adjacent WLs;

F_PLD_H_delta_F: F state threshold for horizontally adjacent WLs; and

F_PLD_H_delta_G: G state threshold for horizontally adjacent WLs.

A control circuit can issue the commands to perform the defect detection process and program operations as discussed herein. The control circuit can be on the same die as the memory cells or on a separate die.

In another possible approach, as mentioned, the defect detection process and program operations are initiated by a device parameter on the memory chip.

Commands can be issued by the off-chip controller 122 to the on-chip control circuitry 110 including the state machine 112, for example. The on-chip control circuitry 110 including the state machine 112 can report back to the controller 122 with the status.

Accordingly, it can be seen that in one implementation, an apparatus comprises: a control circuit configured to connect to a set of memory cells, the set of memory cells are configured to be programmed to a plurality of programmed data states and comprise memory cells connected to a first word line and memory cells connected to a second word line. In a program operation involving the first word line, the control circuit is configured to perform a plurality of program-verify loops until the memory cells connected to the first word line are programmed to the plurality of programmed data states; in a program operation involving the second word line, the control circuit is configured to perform a plurality of program-verify loops until the memory cells connected to the second word line are programmed to the plurality of programmed data states; for at least one comparison data state of the plurality of programmed data states, the control circuit is configured to determine a difference between a number of program-verify loops used to program memory cells connected to the first word line to the comparison data state and a number of program-verify loops used to program memory cells connected to the second word line to the comparison data state; and the control circuit is configured to determine whether a defect is present in the set of memory cells based on whether the first difference exceeds a respective threshold for the at least one comparison data state.

In another implementation, a method comprises: performing a plurality of program-verify loops for memory cells connected to a first word line until the memory cells connected to the first word line are programmed to a plurality of programmed data states; performing a plurality of program-verify loops for memory cells connected to a second word line until the memory cells connected to the second word line are programmed to the plurality of programmed data states; for a first comparison data state of the plurality of programmed data states, determining a first difference between a number of program-verify loops used to program the memory cells connected to the first word line to the first comparison data state and a number of program-verify loops used to program the memory cells connected to the second word line to the first comparison data state; and determining whether a defect is present based on whether the first difference exceeds a respective threshold for the first comparison data state.

In another implementation, an apparatus comprises: a control circuit configured to connect to a set of memory cells, the set of memory cells comprise memory cells connected to a first word line and memory cells connected to a second word line; and an interface connected to the control circuit. The control circuit is configured to issue commands via the interface to: perform a program operation comprising a plurality of program-verify loops for the memory cells connected to the first word line; determine a first number of program-verify loops used to transition the memory cells connected to the first word line between two data states; perform a program operation comprising a plurality of program-verify loops for the memory cells connected to the second word line; determine a second number of program-verify loops used to transition the memory cells connected to the second word line between the two data states; and determine whether a difference between the first number and the second number is within an allowable range.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of memory cells and program the set of memory cells to a plurality of programmed data states, the set of memory cells comprise memory cells connected to a first word line and memory cells connected to a second word line;
in a program operation involving the first word line, the control circuit is configured to perform a plurality of program-verify loops until the memory cells connected to the first word line are programmed to the plurality of programmed data states;
in a program operation involving the second word line, the control circuit is configured to perform a plurality of program-verify loops until the memory cells connected to the second word line are programmed to the plurality of programmed data states;
for at least two comparison data states of the plurality of programmed data states, the control circuit is configured to determine a first difference between a number of program-verify loops used to program memory cells connected to the first word line to a lockout condition of the comparison data state and a number of program-verify loops used to program memory cells connected to the second word line to the lockout condition of the comparison data state; and
the control circuit is configured to determine whether a defect is present in the set of memory cells based on whether the first difference exceeds a respective threshold for the at least two comparison data states and the respective threshold is higher for a higher comparison data state than for a lower comparison data state of the at least two comparison data states.

2. The apparatus of claim 1, wherein:
the control circuit is configured to determine that the defect is present when the first difference exceeds the respective threshold for a single comparison data state of the plurality of programmed data states.

3. The apparatus of claim 1, wherein:
the set of memory cells further comprise memory cells connected to a third word line;
in a program operation involving the third word line, the control circuit is configured to perform a plurality of program-verify loops until the memory cells connected to the third word line are programmed to the plurality of programmed data states;
for the at least two comparison data states of the plurality of programmed data states, the control circuit is configured to determine a second difference between a number of program-verify loops used to program memory cells connected to the first word line to a lockout condition of the comparison data state and a number of program-verify loops used to program memory cells connected to the third word line to the lockout condition of the comparison data state.

4. The apparatus of claim 3, wherein:
the first word line and the second word line are in a first block; and
the third word line is in a second block.

5. The apparatus of claim 1, wherein:
the at least two comparison data states are in an upper half of the plurality of programmed data states.

6. The apparatus of claim 1, wherein:
the first word line and the second word line are adjacent in a block.

7. The apparatus of claim 1, wherein:
the first word line and the second word line are separated by no more than three other word lines in a block.

8. The apparatus of claim 1, wherein: the control circuit is configured to determine that the defect is present when the first difference exceeds the respective threshold for the at least two comparison data states, and when programming of the memory cells connected to the first word line and programming of the memory cells connected to the second word line are completed within an allowable number of program-verify loops.

9. The apparatus of claim 1, wherein:
the first word line and the second word line are in a first block and a second block, respectively.

10. The apparatus of claim 9, wherein: the set of memory cells comprise memory cells connected to a third word line; the third word line is in the first block; in a program operation involving the third word line, the control circuit is configured to perform a plurality of program-verify loops until the memory cells connected to the third word line are programmed to the plurality of programmed data states; for the at least two comparison data states of the plurality of programmed data states, the control circuit is configured to determine a second difference between a number of program-verify loops used to program memory cells connected to the first word line to the comparison data state, and a number of program-verify loops used to program memory cells connected to the third word line to the comparison data state; and the control circuit is configured to determine whether the defect is present based on whether the second difference exceeds a respective threshold for the at least two comparison data states.

11. A method, comprising: performing a plurality of program-verify loops for memory cells connected to a first word line until the memory cells connected to the first word line are programmed to a plurality of programmed data states; performing a plurality of program-verify loops for memory cells connected to a second word line until the memory cells connected to the second word line are programmed to the plurality of programmed data states; for a first comparison data state in an upper half of the plurality of programmed data states, determining a first difference between a number of program-verify loops used to program the memory cells connected to the first word line to a lockout condition of the first comparison data state and a number of program-verify loops used to program the memory cells connected to the second word line to the lockout condition of the first comparison data state; for a second comparison data state in the upper half of the plurality of programmed data states, determining a second difference between a number of program-verify loops used to program the memory cells connected to the first word line to the second comparison data state and a number of program-verify loops used to program memory cells connected to the second word line to the second comparison data state; and determining whether a defect is present based on whether the first difference and the second difference exceeds respective thresholds for the first comparison data state and the second comparison data state.

12. The method of claim 11, wherein:
determining whether the defect is present includes comparing the first difference with a first threshold for the first comparison data state and comparing the second difference with a second threshold for the second comparison data state.

13. The method of claim 11, wherein:
the respective threshold for the first comparison data state is different than the respective threshold for the second comparison data state.

14. The method of claim 12, wherein:
the first comparison data state is higher than the second comparison data state and the first threshold is higher than the second threshold.

15. The method of claim 11, wherein:
the first word line and the second word line are adjacent in a block.

16. An apparatus, comprising:
a control circuit configured to connect to a set of memory cells, the set of memory cells comprise memory cells connected to a first word line and memory cells connected to a second word line; and
an interface connected to the control circuit, the control circuit is configured to issue commands via the interface to:
  perform a program operation comprising a plurality of program-verify loops for the memory cells connected to the first word line;
  determine a first number of program-verify loops used to transition the memory cells connected to the first word line between two data states that are in an upper half of a plurality of programmed data states, the first number of program-verify loops is a difference between a program-verify loop in which programming is completed for a first data state of the two data states and a program-verify loop in which programming is completed for a second data state of the two data states;
  perform a program operation comprising a plurality of program-verify loops for the memory cells connected to the second word line;
  determine a second number of program-verify loops used to transition the memory cells connected to the second word line between the two data states, the second number of program-verify loops is a difference between a program-verify loop in which programming is completed for the first data state of the two data states and a program-verify loop in which programming is completed for the second data state of the two data states; and
  determine whether a difference between the first number and the second number is within an allowable range.

17. The apparatus of claim 16, wherein:
the first word line and the second word line are in a block; and
the control circuit is configured to identify the block as being defective if the difference between the first number and the second number is not within the allowable range.

18. The apparatus of claim 16, wherein:
the first word line is in a first block;
the second word line is in a second block; and
the control circuit is configured to identify the first block as being defective if the difference between the first number and the second number is not within the allowable range, and the first number exceeds the second number.

19. The apparatus of claim 16, wherein:
the memory cells connected to the first word line are programmed to the plurality of programmed data states in the program operation for the memory cells connected to the first word line;
the memory cells connected to the second word line are programmed to the plurality of programmed data states in the program operation for the memory cells connected to the second word line; and
the two data states are programmed data states among the plurality of programmed data states.

20. The apparatus of claim 16, wherein:
the first word line is in a first block;
the second word line is in a second block;
the set of memory cells further comprise memory cells connected to a third word line that is located in the first block;
in the program operation, the control circuit is further configured to issue commands via the interface to perform a plurality of program-verify loops until the memory cells connected to the third word line are programmed to the plurality of programmed data states;
determine a third number of program-verify loops used to transition the memory cells connected to the third word line between the two data states, the third number of program-verify loops is a difference between a program-verify loop in which programming is completed for the first data state of the two data states and a program-verify loop in which programming is completed for the second data state of the two data states.

* * * * *